(12) United States Patent
Chuprakov et al.

(10) Patent No.: US 10,605,060 B2
(45) Date of Patent: Mar. 31, 2020

(54) SYSTEM AND METHOD FOR PERFORMING STIMULATION OPERATIONS

(71) Applicant: SCHLUMBERGER TECHNOLOGY CORPORATION, Sugar Land, TX (US)

(72) Inventors: Dmitry Arefievich Chuprakov, Belmont, MA (US); Romain Charles André Prioul, Somerville, MA (US); Xiaowei Weng, Katy, TX (US); Olga Kresse, Sugar Land, TX (US); Hongren Gu, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 1226 days.

(21) Appl. No.: 14/350,533

(22) PCT Filed: Oct. 11, 2012

(86) PCT No.: PCT/US2012/059774
§ 371 (c)(1),
(2) Date: Apr. 8, 2014

(87) PCT Pub. No.: WO2013/055930
PCT Pub. Date: Apr. 18, 2013

(65) Prior Publication Data
US 2014/0299315 A1    Oct. 9, 2014

Related U.S. Application Data

(60) Provisional application No. 61/545,935, filed on Oct. 11, 2011.

(51) Int. Cl.
*G06G 7/48* (2006.01)
*E21B 43/26* (2006.01)
(Continued)

(52) U.S. Cl.
CPC ............. *E21B 43/26* (2013.01); *E21B 47/00* (2013.01); *G06F 17/50* (2013.01)

(58) Field of Classification Search
None
See application file for complete search history.

(56) References Cited

U.S. PATENT DOCUMENTS

| 6,439,310 B1 | 8/2002 | Scott, III et al. |
| 6,508,307 B1 | 1/2003 | Almaguer |

(Continued)

FOREIGN PATENT DOCUMENTS

| CA | 2785793 A1 | 7/2011 |
| CN | 101900642 A | 12/2010 |
| WO | WO2011077227 | 6/2011 |

OTHER PUBLICATIONS

Zhang, X et al., "Effects of Frictional Geological Discontinuities on Hydraulic Fracture Propagation" Jan. 29-31, 2007, SPE Hydraulic Fracturing Technology Conference, Society of Petroleum Engineers.*

(Continued)

*Primary Examiner* — Cedric Johnson
(74) *Attorney, Agent, or Firm* — Cathy Hewitt

(57) ABSTRACT

A system and method is provided for performing stimulation operations at a wellsite having a subterranean formation with a reservoir therein. The method involves acquiring integrated wellsite data (e.g., geomechanical, geological, and/or geophysical properties of the formation, and/or geometrical properties of the mechanical discontinuities in the formation). The method also involves generating a mechanical earth model using the integrated wellsite data, and identifying a crossing behavior between an induced hydraulic fracture and at least one discontinuity in the formation. The method also involves optimizing a stimulation plan to achieve an optimized crossing behavior. The stimulation plan includes at least one of fluid viscosity, rate of injection of the fracturing fluid, and concentration of a fluid loss additive. The optimization may further include adjusting the stimulation plan to achieve the optimized crossing behavior between the induced hydraulic fracture and the discontinuity in the formation.

25 Claims, 11 Drawing Sheets

(51) Int. Cl.
*E21B 47/00* (2012.01)
*G06F 17/50* (2006.01)

(56) References Cited

U.S. PATENT DOCUMENTS

| | | | |
|---|---|---|---|
| 7,373,978 B2 | 5/2008 | Barry et al. | |
| 7,503,404 B2 | 3/2009 | McDaniel et al. | |
| 8,204,727 B2 | 6/2012 | Dean et al. | |
| 8,812,334 B2 | 8/2014 | Givens et al. | |
| 2004/0089449 A1 | 5/2004 | Walton et al. | |
| 2006/0015310 A1 | 1/2006 | Husen et al. | |
| 2007/0083331 A1 | 4/2007 | Craig | |
| 2007/0272407 A1 | 11/2007 | Lehman et al. | |
| 2007/0294034 A1* | 12/2007 | Bratton | E21B 41/00 702/6 |
| 2008/0164021 A1 | 7/2008 | Dykstra | |
| 2008/0183451 A1 | 7/2008 | Weng et al. | |
| 2008/0190603 A1 | 8/2008 | Brannon | |
| 2009/0089028 A1* | 4/2009 | Sagert | E21B 47/00 703/6 |
| 2009/0187391 A1 | 7/2009 | Wendt et al. | |
| 2010/0307755 A1 | 12/2010 | Xu et al. | |
| 2011/0042080 A1 | 2/2011 | Birchwood et al. | |
| 2011/0060572 A1 | 3/2011 | Brown et al. | |
| 2011/0067857 A1 | 3/2011 | Underhill et al. | |
| 2011/0247824 A1 | 10/2011 | Gu | |
| 2011/0257944 A1* | 10/2011 | Du | E21B 43/267 703/2 |

OTHER PUBLICATIONS

Singhal, B.B.S. et al. "Applied Hydrogeology of Fractured Rocks: Chapter 2: Fractures and Discontinuities", 2010, Springer Science+Business Media B.V. (Year: 2010).*

Office Action issued in Chinese Patent Appl. No. 201280060848.2 dated Nov. 16, 2016; 16 pages (with English translation).

Salimov et al., "Hydraulic Fracturing of Carbonate Formations", M. Oil Industry, 2013, pp. 22-23; 4 pages with translation.

Blanton, T.L., Propagation of Hydraulically and Dynamically Induced Fractures in Naturally Fractured Reservoirs, SPE 15261, Unconventional Gas Technology Symposium, May 18-21, 1986, pp. 613-621 plus 6 sheets of drawings.

Cipolla et al., Integrating Microseismic Mapping and Complex Fracture Modeling to Characterize Fracture Complexity, SPE 140185, SPE Hydraulic Fracturing Technology Conference and Exhibition, Jan. 24-26, 2011, pp. 1-22, Society of Petroleum Engineers.

Gu et al., Hydraulic Fracture Crossing Natural Fracture at Non-orthogonal Angles, A Criterion, Its Validation and Applications, SPE 139984, SPE Hydraulic Fracturing Technology Conference and Exhibition, Jan. 24-26, 2011, pp. 1-11, Society of Petroleum Engineers.

Potluri et al., Effect of Natural Fractures on Hydraulic Fracture Propagation, SPE 94568, SPE European Formation Damage Conference, May 25-27, 2005, pp. 1-6, Society of Petroleum Engineers.

Renshaw et al., An Experimentally Verified Criterion for Propagation Across Unbounded Frictional Interfaces in Brittle, Linear Elastic Materials, Int. J. Rock Mech. Min. Sci. & Geomech. Abstr., 1995, pp. 237-249, vol. 32, No. 3, Great Britain, Elsevier Science Ltd.

Warpinski et al., Influence of Geologic Discontinuities on Hydraulic Fracture Propagation, SPE 13224, 1984 SPE Annual Technical Conference and Exhibition, Sep. 16-19, 1984, published in Journal of Petroleum Science, Feb. 1987, pp. 209-220, together with Discussion (SPE 17011, JPT, Aug. 1987, p. 998) and Authors' Reply (SPE 17074, JPT, Aug. 1997, p. 999).

Extended Search Report issued in European Patent Application No. 12839442.6 dated Jun. 13, 2016; 11 pages.

Office Action issued in Canadian Patent Appl. No. 2852044 dated Jul. 26, 2018; 4 pages.

\* cited by examiner

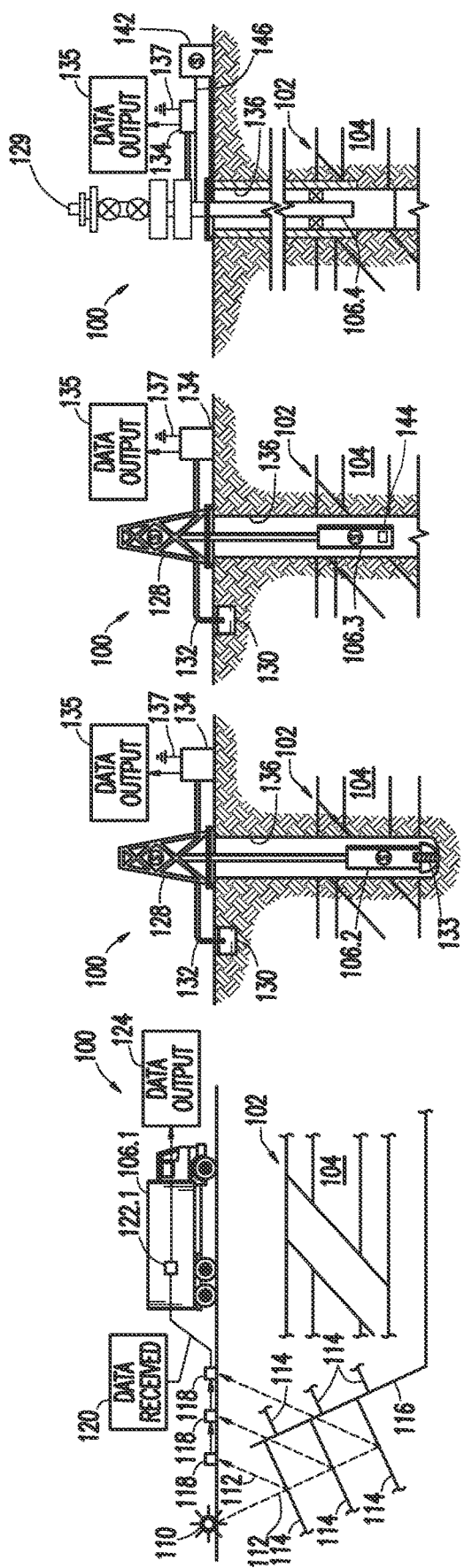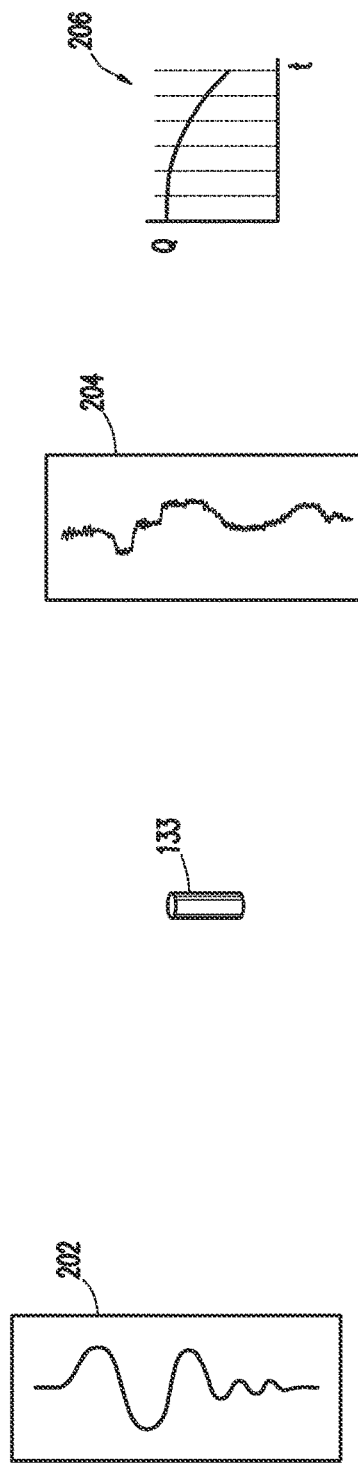

SYSTEM AND METHOD FOR PERFORMING STIMULATION OPERATIONS

CROSS-REFERENCE TO RELATED APPLICATIONS

This application claims benefit of priority to U.S. Provisional Application No. 61/545,935, filed on Oct. 11, 2011, entitled METHOD OF CONTROLLING HYDRAULIC FRACTURING ACROSS PRE-EXISTING PERMEABLE DISCONTINUITIES, the entire contents of which is hereby incorporated by reference.

BACKGROUND

The present disclosure relates generally to methods and systems for performing oilfield operations. More particularly, the present disclosure relates to methods and systems for performing stimulation operations, such as investigating subterranean formations, characterizing hydraulic fracture networks in a subterranean formation, and generating stimulation plans.

The statements made herein merely provide information related to the present disclosure and may not constitute prior art, and may describe some embodiments illustrating the invention.

In order to facilitate the recovery of hydrocarbons from oil and gas wells, the subterranean formations surrounding such wells can be hydraulically fractured. Hydraulic fracturing has become a valuable technique to create cracks in subsurface formations that allow hydrocarbons to move toward the well. Hydraulic fractures may extend away from the wellbore hundreds of feet in two opposing directions according to the natural stresses within the formation. Under certain circumstances, they may form a complex fracture network. Complex fracture networks can include induced hydraulic fractures and natural fractures, which may or may not intersect, along multiple azimuths, in multiple planes and directions, and in multiple regions.

A formation is fractured by introducing a specially engineered fluid (referred to as "fracturing fluid" or "fracturing slurry") at high pressure and high flow rates into the formation through one or more wellbores. Oilfield service companies have developed a number of different oil- and water-based fluids and treatments to more efficiently induce and maintain permeable and productive fractures. The composition of these fluids varies significantly, from simple water and sand to complex polymeric substances with a multitude of additives. Each type of fracturing fluid has unique characteristics, and each possesses its own positive and negative performance traits. It is desirable to selectively modify certain qualities of the fracturing fluid, and pumping characteristics, to achieve a desired complexity of the fracture network.

For example, a highly complex fracture network geometry with tortuous fractures, multiple kinking and changes in fracture directions may make the fracture opening too narrow or create pinch points that hampers hydrocarbon or particle transport. To achieve better production of fractured reservoirs, it is desirable to create relatively straight and open hydraulic fractures.

In some cases, the occurrence of fractures and the extent of the fractures in the formation may be numerically modeled to infer hydraulic fracture propagation over time. Conventional hydraulic fracture models typically assume a bi-wing type induced fracture. These bi-wing fractures may be short in representing the complex nature of induced fractures in some unconventional reservoirs with pre-existing discontinuities, such as natural fractures (NF). Moreover, while some commercially available fracture models may take into account pre-existing natural fractures in the formation, many of the published models are oversimplified and neglect to account for the rigorous elastic solution of the interaction between induced fractures and natural fractures. Further, the vast majority of published models do not explicitly take into account the pumping properties of the fluid, which may include the injection rate, viscous properties of the fluid, and concentration of fluid additives.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

The techniques disclosed herein relate to oilfield operations involving acquiring integrated wellsite data (e.g., geomechanical, geological, and/or geophysical properties of the formation, and/or mechanical and geometrical properties of the mechanical discontinuities in the formation). The oilfield operation may also comprise generating a mechanical earth model using the integrated wellsite data, and identifying a crossing behavior between an induced hydraulic fracture and at least one discontinuity in the formation. The oilfield operation may be optimized by using the mechanical earth model to generate a stimulation plan, which includes fluid viscosity and rate of injection of the fracturing fluid. The optimization may further include adjusting the stimulation plan to achieve an optimized crossing behavior between the induced hydraulic fracture and the discontinuity in the formation.

BRIEF DESCRIPTION OF THE DRAWINGS

Embodiments of the method and system for performing a downhole stimulation operation are described with reference to the following figures. Like reference numerals are intended to refer to similar elements for consistency. For purposes of clarity, not every component may be labeled in every drawing.

FIGS. 1A-1D are schematic views illustrating various oilfield operations at a wellsite;

FIGS. 2A-2D are schematic views of data collected by the operations of FIGS. 1A-1D;

DETAILED DESCRIPTION

Figure 3A:
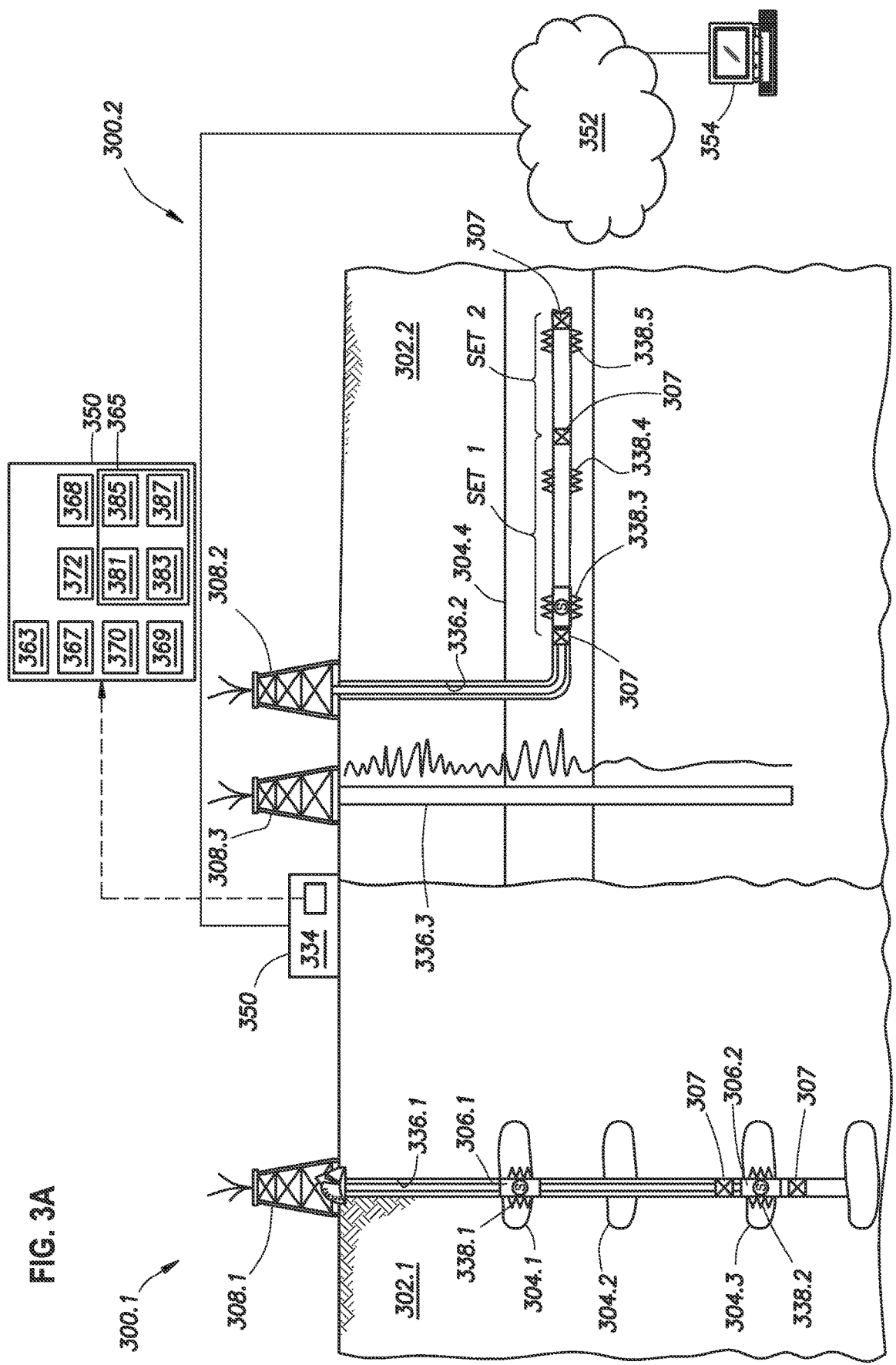
FIG. 3A is a schematic view of a wellsite illustrating various downhole stimulation operations.

The description that follows includes exemplary systems, apparatuses, methods, and instruction sequences that embody techniques of the subject matter herein. However, it is understood that the described embodiments may be practiced without these specific details.

The present disclosure relates to design, implementation and feedback of stimulation operations performed at a wellsite. The stimulation operations may be performed using a reservoir centric, integrated approach. These stimulation operations may involve integrated stimulation design based on multi-disciplinary information (e.g., used by a petrophysicist, geologist, geomechanicist, geophysicist and a reservoir engineer), multi-well applications, and/or multistage oilfield operations (e.g., completion, stimulation, and production). Some applications may be tailored to unconventional wellsite applications (e.g., tight gas, shale, carbonate, coal, etc.), complex wellsite applications (e.g., multi-well), and various fracture models (e.g., conventional planar bi-wing fracture models for sandstone reservoirs or complex network fracture models for naturally fractured low permeability reservoirs), and the like. As used herein unconventional reservoirs relate to reservoirs, such as tight gas, sand, shale, carbonate, coal, and the like, where the formation is not uniform or is intersected by natural fractures (all other reservoirs are considered conventional).

The stimulation operations may also be performed using optimization, tailoring for specific types of reservoirs (e.g., tight gas, shale, carbonate, coal, etc.), integrating evaluations criteria (e.g., reservoir and completion criteria), and integrating data from multiple sources. The stimulation operations may be performed manually using conventional techniques to separately analyze dataflow, with separate analysis being disconnected and/or involving a human operator to manually move data and integrate data using multiple software applications and tools. These stimulation operations may also be integrated, for example, streamlined by maximizing multi-disciplinary data in an automated or semi-automated manner.

Oilfield Operations

FIGS. 1A-1D depict various oilfield operations that may be performed at a wellsite, and FIGS. 2A-2D depict various information that may be collected at the wellsite. FIGS. 1A-1D depict simplified, schematic views of a representative oilfield or wellsite 100 having subsurface formation 102 containing, for example, reservoir 104 therein and depicting various oilfield operations being performed on the wellsite 100. FIG. 1A depicts a survey operation being performed by a survey tool, such as seismic truck 106.1, to measure properties of the subsurface formation. The survey operation may be a seismic survey operation for producing sound vibrations. In FIG. 1A, one such sound vibration 112 generated by a source 110 reflects off a plurality of discontinuities 114 in an earth formation 116. The sound vibration(s) 112 may be received by sensors, such as geophone-receivers 118, situated on the earth's surface, and the geophones 118 produce electrical output signals, referred to as data received 120 in FIG. 1A.

In response to the received sound vibration(s) 112 representative of different parameters (such as amplitude and/or frequency) of the sound vibration(s) 112, the geophones 118 may produce electrical output signals containing data concerning the subsurface formation. The data received 120 may be provided as input data to a computer 122.1 of the seismic truck 106.1, and responsive to the input data, the computer 122.1 may generate a seismic and microseismic data output 124. The seismic data output 124 may be stored, transmitted or further processed as desired, for example by data reduction.

FIG. 1B depicts a drilling operation being performed by a drilling tool 106.2 suspended by a rig 128 and advanced into the subsurface formations 102 to form a wellbore 136 or other channel. A mud pit 130 may be used to draw drilling mud into the drilling tools via flow line 132 for circulating drilling mud through the drilling tools, up the wellbore 136 and back to the surface. The drilling mud may be filtered and returned to the mud pit. A circulating system may be used for storing, controlling or filtering the flowing drilling muds. In this illustration, the drilling tools are advanced into the subsurface formations to reach reservoir 104. Each well may target one or more reservoirs. The drilling tools may be adapted for measuring downhole properties using logging while drilling tools. The logging while drilling tool may also be adapted for taking a core sample 133 as shown in FIGS. 1B and 2B, or removed so that a core sample 133 may be taken using another tool.

A surface unit 134 may be used to communicate with the drilling tool 106.2 and/or offsite operations. The surface unit 134 may communicate with the drilling tool 106.2 to send commands to the drilling tool 106.2, and to receive data therefrom. The surface unit 134 may be provided with computer facilities for receiving, storing, processing, and/or analyzing data from the operation. The surface unit 134 may collect data generated during the drilling operation and produce data output 135 which may be stored or transmitted. Computer facilities, such as those of the surface unit 134, may be positioned at various locations about the wellsite and/or at remote locations.

Sensors (S), such as gauges, may be positioned about the oilfield to collect data relating to various operations as described previously. As shown, the sensor (S) may be positioned in one or more locations in the drilling tool 106.2 and/or at the rig to measure drilling parameters, such as weight on bit, torque on bit, pressures, temperatures, flow rates, compositions, rotary speed and/or other parameters of the operation. Sensors (S) may also be positioned in one or more locations in the circulating system.

The data gathered by the sensors may be collected by the surface unit 134 and/or other data collection sources for analysis or other processing. The data collected by the sensors may be used alone or in combination with other data. The data may be collected in one or more databases and/or transmitted on or offsite. All or select portions of the data may be selectively used for analyzing and/or predicting operations of the current and/or other wellbores. The data may be historical data, real-time data or combinations thereof. The real-time data may be used in real-time, or stored for later use. The data may also be combined with historical data or other inputs for further analysis. The data may be stored in separate databases, or combined into a single database.

The collected data may be used to perform analysis, such as modeling operations. For example, the seismic data output may be used to perform geological, geophysical, and/or reservoir engineering analysis. The reservoir, wellbore, surface and/or processed data may be used to perform reservoir, wellbore, geological, and geophysical or other simulations. The data outputs from the operation may be generated directly from the sensors, or after some preprocessing or modeling. These data outputs may act as inputs for further analysis.

The data may be collected and stored at the surface unit 134. One or more surface units 134 may be located at the wellsite, or connected remotely thereto. The surface unit 134 may be a single unit, or a complex network of units used to perform the necessary data management functions throughout the oilfield. The surface unit 134 may be a manual or automatic system. The surface unit 134 may be operated and/or adjusted by a user.

The surface unit 134 may be provided with a transceiver 137 to allow communications between the surface unit 134 and various portions of the current oilfield or other locations. The surface unit 134 may also be provided with or functionally connected to one or more controllers for actuating mechanisms at the wellsite 100. The surface unit 134 may then send command signals to the oilfield in response to data received. The surface unit 134 may receive commands via the transceiver or may itself execute commands to the controller. A processor may be provided to analyze the data (locally or remotely), make the decisions and/or actuate the controller. In this manner, operations may be selectively adjusted based on the data collected. Portions of the operation, such as controlling drilling, weight on bit, pump rates or other parameters, may be optimized based on the information. These adjustments may be made automatically based on computer protocol, and/or manually by an operator. In some cases, well plans may be adjusted to select optimum operating conditions, or to avoid problems.

FIG. 1C depicts a wireline operation being performed by a wireline tool 106.3 suspended by the rig 128 and into the wellbore 136 of FIG. 1B. The wireline tool 106.3 may be adapted for deployment into a wellbore 136 for generating well logs, performing downhole tests and/or collecting samples. The wireline tool 106.3 may be used to provide another method and apparatus for performing a seismic survey operation. The wireline tool 106.3 of FIG. 1C may, for example, have an explosive, radioactive, electrical, or acoustic energy source 144 that sends and/or receives electrical signals to the surrounding subsurface formations 102 and fluids therein.

The wireline tool 106.3 may be operatively connected to, for example, the geophones 118 and the computer 122.1 of the seismic truck 106.1 of FIG. 1A. The wireline tool 106.3 may also provide data to the surface unit 134. The surface unit 134 may collect data generated during the wireline operation and produce data output 135 which may be stored or transmitted. The wireline tool 106.3 may be positioned at various depths in the wellbore 136 to provide a survey or other information relating to the subsurface formation.

Sensors (S), such as gauges, may be positioned about the wellsite 100 to collect data relating to various operations as described previously. As shown, the sensor (S) is positioned in the wireline tool 106.3 to measure downhole parameters which relate to, for example porosity, permeability, fluid composition and/or other parameters of the operation.

FIG. 1D depicts a production operation being performed by a production tool 106.4 deployed from a production unit or Christmas tree 129 and into the completed wellbore 136 of FIG. 1C for drawing fluid from the downhole reservoirs into surface facilities 142. Fluid flows from reservoir 104 through perforations in the casing (not shown) and into the production tool 106.4 in the wellbore 136 and to the surface facilities 142 via a gathering network 146.

Sensors (S), such as gauges, may be positioned about the oilfield to collect data relating to various operations as described previously. As shown, the sensor (S) may be positioned in the production tool 106.4 or associated equipment, such as the Christmas tree 129, gathering network, surface facilities and/or the production facility, to measure fluid parameters, such as fluid composition, flow rates, pressures, temperatures, and/or other parameters of the production operation.

While only simplified wellsite configurations are shown, it will be appreciated that the oilfield or wellsite 100 may cover a portion of land, sea and/or water locations that hosts one or more wellsites. Production may also include injection wells (not shown) for added recovery or for storage of hydrocarbons, carbon dioxide, or water, for example. One or more gathering facilities may be operatively connected to one or more of the wellsites for selectively collecting downhole fluids from the wellsite(s).

It should be appreciated that FIGS. 1B-1D depict tools that can be used to measure not only properties of an oilfield, but also properties of non-oilfield operations, such as mines, aquifers, storage, and other subsurface facilities. Also, while certain data acquisition tools are depicted, it will be appreciated that various measurement tools (e.g., wireline, measurement while drilling (MWD), logging while drilling (LWD), core sample, etc.) capable of sensing parameters, such as seismic two-way travel time, density, resistivity, production rate, etc., of the subsurface formation and/or its geological formations may be used. Various sensors (S) may be located at various positions along the wellbore and/or the monitoring tools to collect and/or monitor the desired data. Other sources of data may also be provided from offsite locations.

The oilfield configuration of FIGS. 1A-1D depict examples of a wellsite 100 and various operations usable with the techniques provided herein. Part, or all, of the oilfield may be on land, water and/or sea. Also, while a single oilfield measured at a single location is depicted, reservoir engineering may be utilized with any combination of one or more oilfields, one or more processing facilities, and one or more wellsites.

FIGS. 2A-2D are graphical depictions of examples of data collected by the tools of FIGS. 1A-1D, respectively. FIG. 2A depicts a seismic trace 202 of the subsurface formation of FIG. 1A taken by seismic truck 106.1. The seismic trace 202 may be used to provide data, such as a two-way response over a period of time. FIG. 2B depicts a core sample 133 taken by the drilling tools 106.2. The core sample may be used to provide data, such as a graph of the density, porosity, permeability or other physical property of the core sample over the length of the core. Tests for density and viscosity may be performed on the fluids in the core at varying pressures and temperatures. FIG. 2C depicts a well log 204 of the subsurface formation of FIG. 1C taken by the wireline tool 106.3. The well log 204 may provide a resistivity or other measurement of the formation at various depts. FIG. 2D depicts a production decline curve or graph 206 of fluid flowing through the subsurface formation of FIG. 1D measured at the surface facilities 142. The production decline curve may provide the production rate Q as a function of time t.

The respective graphs of FIGS. 2A, 2C, and 2D depict examples of static measurements that may describe or provide information about the physical characteristics of the formation and reservoirs contained therein. These measurements may be analyzed to define properties of the formation(s), to determine the accuracy of the measurements and/or to check for errors. The plots of each of the respective measurements may be aligned and scaled for comparison and verification of the properties.

FIG. 2D depicts an example of a dynamic measurement of the fluid properties through the wellbore. As the fluid flows through the wellbore, measurements are taken of fluid properties, such as flow rates, pressures, composition, etc. As described below, the static and dynamic measurements may be analyzed and used to generate models of the sub-surface formation to determine characteristics thereof. Similar measurements may also be used to measure changes in formation aspects over time.

Stimulation Operations

FIG. 3A depicts stimulation operations performed at wellsites 300.1 and 300.2. The wellsite 300.1 includes a rig 308.1 having a vertical wellbore 336.1 extending into a formation 302.1. Wellsite 300.2 includes rig 308.2 having wellbore 336.2 and rig 308.3 having wellbore 336.3 extending therebelow into a subterranean formation 302.2. While the wellsites 300.1 and 300.2 are shown having specific configurations of rigs with wellbores, it will be appreciated that one or more rigs with one or more wellbores may be positioned at one or more wellsites.

Wellbore 336.1 extends from rig 308.1, through unconventional reservoirs 304.1-304.3. Wellbores 336.2 and 336.3 extend from rigs 308.2 and 308.3, respectfully to unconventional reservoir 304.4. As shown, unconventional reservoirs 304.1-304.3 are tight gas sand reservoirs and unconventional reservoir 304.4 is a shale reservoir. One or more unconventional reservoirs (e.g., such as tight gas, shale, carbonate, coal, heavy oil, etc.) and/or conventional reservoirs may be present in a given formation.

The stimulation operations of FIG. 3A may be performed alone or in conjunction with other oilfield operations, such as the oilfield operations of FIGS. 1A and 1D. For example, wellbores 336.1-336.3 may be measured, drilled, tested and produced as shown in FIGS. 1A-1D. Stimulation operations performed at the wellsites 300.1 and 300.2 may involve, for example, perforation, fracturing, injection, and the like. The stimulation operations may be performed in conjunction with other oilfield operations, such as completions and production operations (see, e.g., FIG. 1D). As shown in FIG. 3A, the wellbores 336.1 and 336.2 have been completed and provided with perforations 338.1-338.5 to facilitate production.

Downhole tool 306.1 is positioned in vertical wellbore 336.1 adjacent tight gas sand reservoirs 304.1 for taking downhole measurements. Packers 307 are positioned in the wellbore 336.1 for isolating a portion thereof, proximate adjacent perforations 338.2. Once the perforations are formed about the wellbore fluid may be injected through the perforations and into the formation to create and/or expand fractures therein to stimulate production from the reservoirs.

Reservoir 304.4 of formation 302.2 has been perforated and packers 307 have been positioned to isolate the wellbore 336.2 about the perforations 338.3-338.5. As shown in the horizontal wellbore 336.2, packers 307 have been positioned at stages $St_1$ and $St_2$ of the wellbore. As also depicted, wellbore 304.3 may be an offset (or pilot) well extended through the formation 302.2 to reach reservoir 304.4. One or more wellbores may be placed at one or more wellsites. Multiple wellbores may be placed as desired.

Figure 3B:
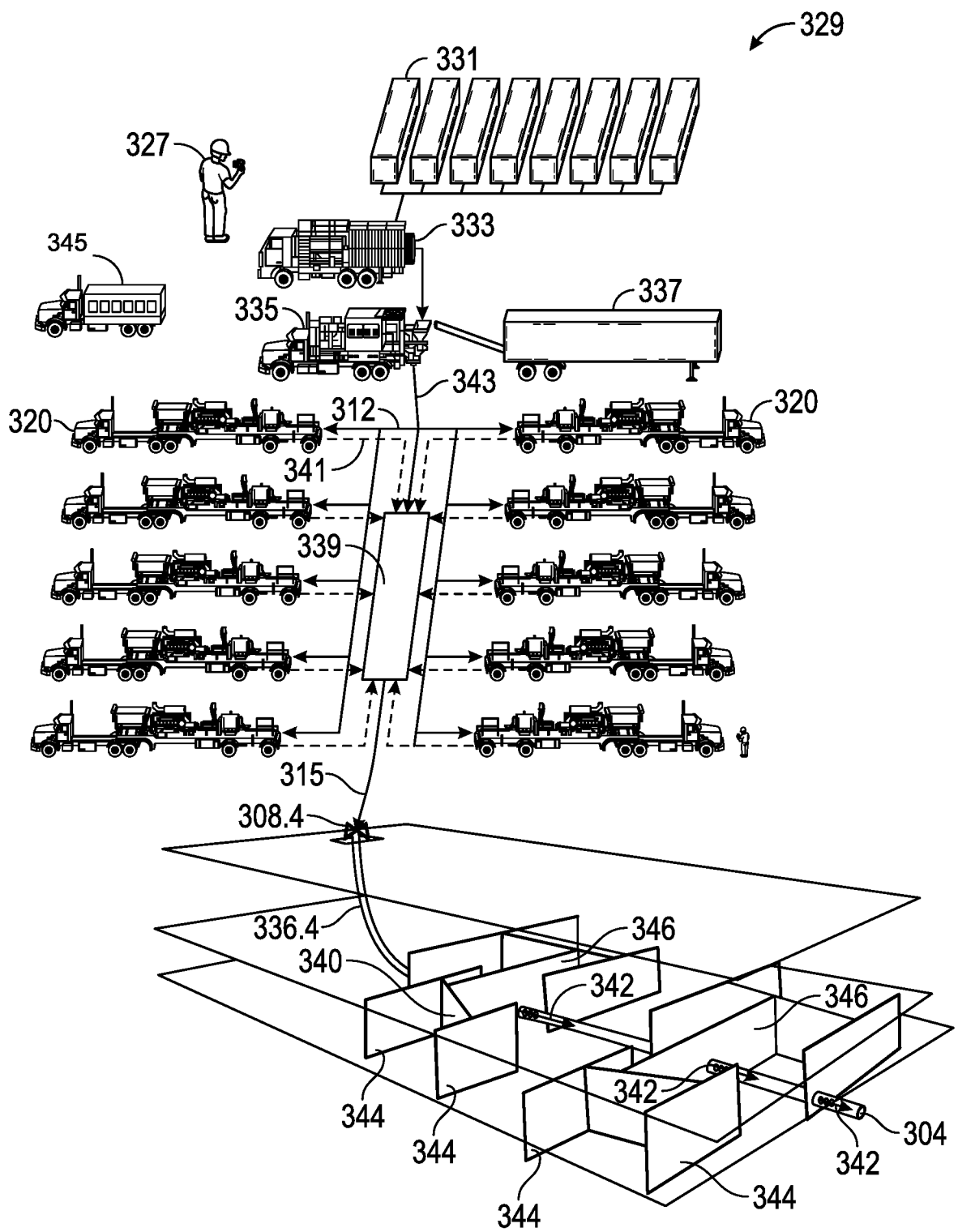
FIGS. 3B-3D are schematic views of various fractures of the wellsite of FIG. 3A.
Figure 3D:
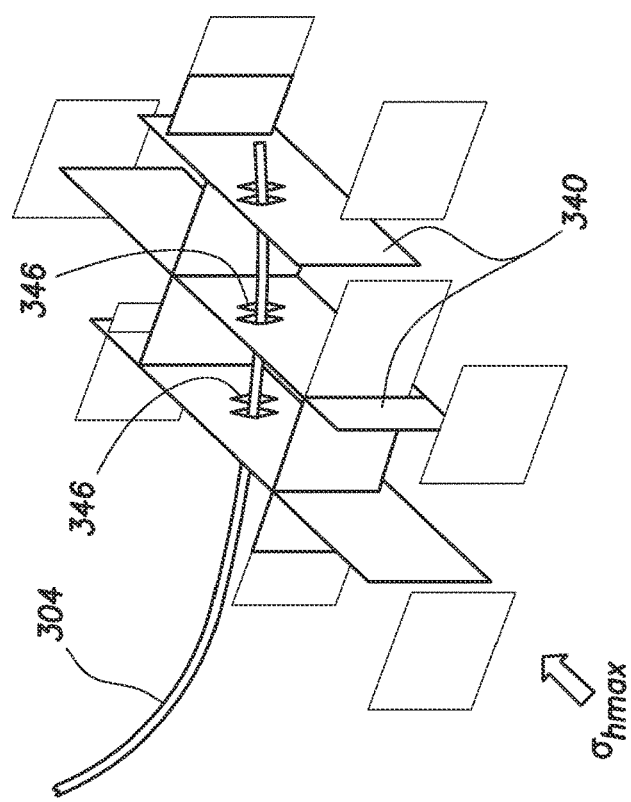
Figure 3C:
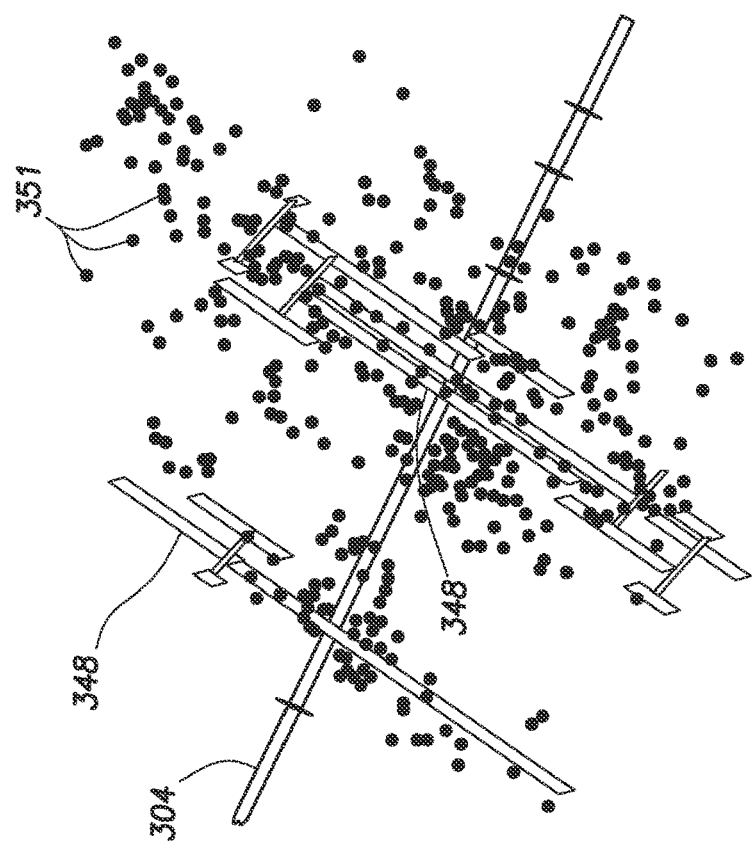

Fractures may be extended into the various reservoirs 304.1-304.4 for facilitating production of fluids therefrom. Examples of fractures that may be formed are schematically shown in FIGS. 3B-3D about a wellbore 304. As shown in FIGS. 3B-3C, mechanical discontinuities 340, such as natural fractures, bedding planes, faults, and planes of weakness, extend in layers in the formation. Perforations (or perforation clusters) 342 may be formed about the wellbore 304, and fluids 344 and/or fluids mixed with proppant 346 may be injected through the perforations 342. As shown in FIGS. 3B-3C, hydraulic fracturing may be performed by injecting through the perforations 342, creating fractures along a maximum stress plane $\sigma_{max}$ and opening and extending the natural fractures.

At the surface of the wellsite shown in FIG. 3B, a pumping system 329 is positioned about the wellhead 308.4 for passing fluids 344 and/or fluids mixed with proppant 346 therein through tubing 315.

The pumping system 329 is depicted as being operated by a field operator 327 for recording maintenance and operational data and/or performing maintenance in accordance with a prescribed maintenance plan. The pumping system 329 pumps the fluid 344 from the surface to the wellbore 304, 336.4 during an oilfield operation.

In one example arrangement, the pumping system 329 may include a plurality of water tanks 331, which feed water to a gel hydration unit 333. The gel hydration unit 333 combines water from the tanks 331 with a gelling agent to form a gel. The gel is then sent to a blender 335 where it is mixed with a proppant from a proppant transport unit 337 to form a fracturing fluid 344. The gelling agent may be used to increase the viscosity of the fracturing fluid and allows the proppant to be suspended in the fracturing fluid. It may also act as a friction reducing agent to allow higher pump rates with less frictional pressure. The gel hydration unit 333 may combine additional fluid additives to the water to form a fracturing fluid 344 with specific properties.

The fracturing fluid 344 is then pumped from the blender 335 to the treatment trucks 320 with plunger pumps as shown by solid lines 343. Each treatment truck 320 receives the fracturing fluid at a low pressure, shown by solid lines 312, and discharges it to a common manifold 339 (sometimes called a missile trailer or missile) at a high pressure as shown by dashed lines 341. The missile 339 then directs the fracturing fluid from the treatment trucks 320 to the wellbore 304 as shown by solid line 315. One or more treatment trucks 320 may be used to supply fracturing fluid at a desired rate.

Each treatment truck 320 may be normally operated at any rate, such as well under its maximum operating capacity. Operating the treatment trucks 320 under their operating capacity may allow for one to fail and the remaining to be run at a higher speed in order to make up for the absence of the failed pump. As shown, a computerized control system 345 may be employed to direct the entire pump system 329 during the fracturing operation.

FIG. 3D shows another view of the fracturing operation about the wellbore 304. In this view, the induced fractures 348 extend radially about the wellbore 304. The induced fractures may be used to reach the pockets of microseismic events 351 (shown schematically as dots) about the wellbore 304. The fracture operation may be used as part of the stimulation operation to provide pathways for facilitating movement of hydrocarbons to the wellbore 304 for production.

Referring back to FIG. 3A, sensors (S), such as gauges, may be positioned about the oilfield to collect data relating to various operations as described previously. Some sensors, such as geophones, may be positioned about the formations during fracturing for measuring microseismic waves and performing microseismic mapping. The data gathered by the sensors may be collected by the surface unit 334 and/or other data collection sources for analysis or other processing as previously described (see, e.g., surface unit 134). As shown, surface unit 334 is linked to a network 352 and other computers 354.

A stimulation tool 350 may be provided as part of the surface unit 334 or other portions of the wellsite for performing stimulation operations. For example, information generated during one or more of the stimulation operations may be used in well planning for one or more wells, one or more wellsites and/or one or more reservoirs. The stimulation tool 350 may be operatively linked to one or more rigs and/or wellsites, and used to receive data, process data, send control signals, etc., as will be described further herein. The stimulation tool 350 may include a reservoir characterization unit 363 for generating a mechanical earth model (MEM), a stimulation planning unit 365 for generating stimulation plans, an optimizer 367 for optimizing the stimulation plans, a real-time unit 369 for optimizing in real-time the optimized stimulation plan, a control unit 368 for selectively adjusting the stimulation operation based on the real-time optimized stimulation plan, an updater 370 for updating the reservoir characterization model based on the real-time optimized stimulation plan and post evaluation data, and a calibrator 372 for calibrating the optimized stimulation plan as will be described further herein. The stimulation planning unit 365 may include a staging design tool 381 for performing staging design, a stimulation design tool 383 for performing stimulation design, a production prediction tool 385 for predicting production and a well planning tool 387 for generating well plans.

Wellsite data used in the stimulation operation may range from, for example, core samples to petrophysical interpretation based on well logs to three dimensional seismic data (see, e.g., FIGS. 2A-2D). Stimulation design may employ, for example, oilfield petrotechnical experts to conduct manual processes to collate different pieces of information. Integration of the information may involve manual manipulation of disconnected workflows and outputs, such as delineation of a reservoir zones, identification of desired completion zones, estimation of anticipated hydraulic fracture growth for a given completion equipment configurations, decision on whether and where to place another well or a plurality of wells for better stimulation of the formation, and the like. This stimulation design may also involve semi-automatic or automatic integration, feedback and control to facilitate the stimulation operation.

Stimulation operations for conventional and unconventional reservoirs may be performed based on knowledge of the reservoir. Reservoir characterization may be used, for example, in well planning, identifying optimal target zones for perforation and staging, design of multiple wells (e.g., spacing and orientation), and geomechanical models. Stimulation designs may be optimized based on a resulting production prediction. These stimulation designs may involve an integrated reservoir centric workflow which include design, real-time (RT), and post treatment evaluation components. Well completion and stimulation design may be performed while making use of multi-disciplinary wellbore and reservoir data.

Figure 4A:
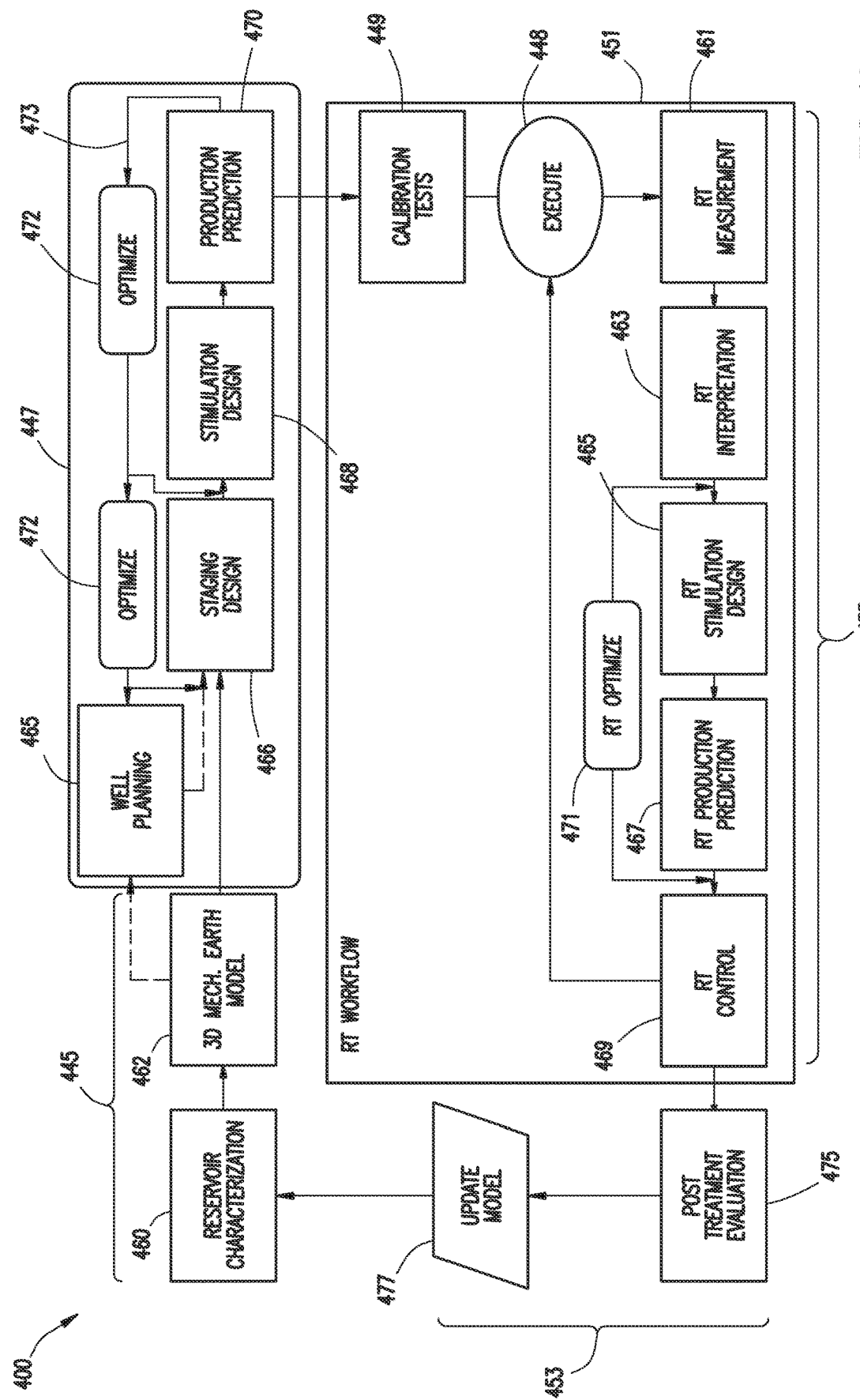
FIG. 4A is a schematic flow diagram depicting a downhole stimulation operation.

FIG. 4A is a schematic flow diagram 400 depicting a stimulation operation, such as those shown in FIG. 3A. The flow diagram 400 is an iterative process that uses integrated information and analysis to design, implement and update a stimulation operation. The method involves pre-treatment/ pre-stimulation evaluation 445, stimulation planning 447, real-time treatment optimization 451, and design/model update 453. Part or all of the flow diagram 400 may be iterated to adjust stimulation operations and/or design additional stimulation operations in existing or additional wells.

The pre-stimulation evaluation 445 involves reservoir characterization 460 and generating a three-dimensional mechanical earth model (MEM) 462. The reservoir characterization 460 may be generated by integrating information, such as the information gathered in FIGS. 1A-1D, to perform modeling using united combinations of information from historically independent technical regimes or disciplines (e.g., petrophysicist, geologist, geomechanic and geophysicist, and previous fracture treatment results). Such reservoir characterization 460 may be generated using integrated static modeling techniques to generate the MEM 462 as described, for example, in US Patent Application Nos. 2009/0187391 and 2011/060572, the entire contents of which are hereby incorporated by reference. By way of example, software, such as PETREL™, VISAGE™, TECHLOG™, and GEOFRAME™ commercially available from SCHLUMBERGER™, may be used to perform the pre-treatment evaluation 445.

Reservoir characterization 460 may involve capturing a variety of information, such as data associated with the underground formation and developing one or more models of the reservoir. The information captured may include, for example, reservoir (pay) zone, geomechanical (stress, elasticity, and the like) zone, geometrical (fracture orientation and size) distribution of the mechanical discontinuities (natural fractures) in the formation, and mechanical (permeability, conductivity, stress, fracture toughness, tensile strength, and the like) of the discontinuities. The reservoir characterization 460 may be performed such that information concerning the stimulation operation is included in pre-stimulation evaluations. Generating the MEM 462 may simulate the subterranean formation under development (e.g., generating a numerical representation of a state of stress and formation mechanical properties for a given stratigraphic section in an oilfield or basin).

Conventional geomechanical modeling may be used to generate the MEM 462. Examples of MEM techniques are provided in US Patent Application No. 2009/0187391, the entire contents of which is hereby incorporated by reference. The MEM 462 may be generated by information gathered using, for example, the oilfield operations of FIGS. 1A-1D, 2A-2D and 3A-3D. For example, the three-dimensional MEM may take into account various reservoir data collected beforehand, including the seismic data collected during early exploration of the formation and logging data collected from the drilling of one or more exploration wells before production (see, e.g., FIGS. 1A-1D). The MEM 462 may be used to provide, for example, geomechanical information for various oilfield operations, such as casing point selection, optimizing the number of casing strings, drilling stable wellbores, designing completions, performing fracture stimulation, etc.

The generated MEM 462 may be used as an input in performing stimulation planning 447. The three-dimensional MEM may be constructed to identify potential drilling wellsites. In one embodiment, when the formation is substantially uniform and is substantially free of major natural fractures and/or high-stress barriers, it can be assumed that a given volume of fracturing fluid pumped at a given rate over a given period of time will generate a substantially identical fracture network in the formation. In another embodiment, when the formation includes a complex network of mechanical discontinuities and/or high stress barriers, a desired stimulated area, volume and/or shape of volume may be achieved by adjusting at least one of the fluid viscosity, the rate of injection, and the fluid loss additives to thereby optimize the crossing behaviors between the induced fracture and the discontinuities present in the formation. Seismic data 202, such as those shown in FIGS. 1A and 2A, may provide useful information in analyzing fracture properties of the formation.

The stimulation planning 447 may involve well planning 465, staging design 466, stimulation design 468, and production prediction 470. In particular, the MEM 462 may be an input to the well planning 465 and/or the staging design 466 and stimulation design 468. Some embodiments may include semi-automated methods to identify, for example, well spacing and orientation, multistage perforation design and hydraulic fracture design. To address a wide variation of characteristics in hydrocarbon reservoirs, some embodiments may involve dedicated methods per target reservoir environments, such as, but not limited to, tight gas formations, sandstone reservoirs, naturally fractured shale reservoirs, or other unconventional reservoirs.

The stimulation planning 447 may involve a semi-automated method used to identify potential drilling wellsites by partitioning underground formations into multiple set of discrete intervals, characterizing each interval based on information such as the formation's geophysical properties and its proximity to natural fractures, then regrouping multiple intervals into one or multiple drilling wellsites, with each wellsite receiving a well or a branch of a well. The spacing and orientation of the multiple wells may be determined and used in optimizing production of the reservoir. Characteristics of each well may be analyzed for stage planning and stimulation planning. In some cases, a completion advisor may be provided, for example, for analyzing vertical or near vertical wells in tight-gas sandstone reservoir following a recursive refinement workflow.

Well planning 465 may be performed to design oilfield operations in advance of performing such oilfield operations at the wellsite. The well planning 465 may be used to define, for example, equipment and operating parameters for performing the oilfield operations. Some such operating parameters may include, for example, perforating locations, injection rate, operating pressures, stimulation fluids, and other parameters used in stimulation. Information gathered from various sources, such as historical data, known data, and oilfield measurements (e.g., those taken in FIGS. 1A-1D), may be used in designing a well plan. In some cases, modeling may be used to analyze data used in forming a well plan. The well plan generated in the stimulation planning may receive inputs from the staging design 466, stimulation design 468, and production prediction 470 so that information relating to and/or affecting stimulation is evaluated in the well plan.

The well planning 465 and/or MEM 462 may also be used as inputs into the staging design 466. Reservoir and other data may be used in the staging design 466 to define certain operational parameters for stimulation. For example, staging design 466 may involve defining boundaries in a wellbore for performing stimulation operations as described further herein. Examples of staging design are described in US Patent Application No. 2011/0247824, the entire contents of which is hereby incorporated by reference. Staging design may be an input for performing stimulation design 468.

Stimulation design defines various stimulation parameters (e.g., perforation placement) for performing stimulation operations. The stimulation design 468 may be used, for example, for fracture modeling. Examples of fracture modeling are described in US Patent Application No. 2008/0183451, 2006/0015310 and PCT Publication No. WO2011/077227, the entire contents of which are hereby incorporated by reference. Stimulation design may involve using various models to define a stimulation plan and/or a stimulation portion of a well plan. Additional examples of complex fracture modeling are provided in SPE Paper 140185, the entire contents of which is hereby incorporated by reference. This complex fracture modeling illustrates the application of two complex fracture modeling techniques in conjunction with microseismic mapping to characterize fracture complexity and evaluate completion performance. The first complex fracture modeling technique is an analytical model for estimating fracture complexity and distances between orthogonal fractures. The second technique uses a gridded numerical model that allows complex geologic descriptions and evaluation of complex fracture propagation. These examples illustrate how embodiments may be utilized to evaluate how fracture complexity is impacted by changes in fracture treatment design in each geologic environment. To quantify the impact of changes in fracture design using complex fracture models despite inherent uncertainties in the MEM and "real" fracture growth, microseismic mapping and complex fracture modeling may be integrated for interpretation of the microseismic measurements while also calibrating the complex stimulation model. Such examples show that the degree of fracture complexity can vary depending on geologic conditions.

Stimulation design may integrate three-dimensional reservoir models (formation models), which can be a result of seismic interpretation, drilling geo-steering interpretation, geological or geomechanical earth model, as a starting point (zone model) for completion design. For some stimulation designs, a fracture modeling algorithm may be used to read a three-dimensional MEM and run forward modeling to predict fracture growth. This process may be used so that spatial heterogeneity of a complex reservoir may be taken into account in stimulation operations.

Stimulation design may use three-dimensional reservoir models for providing information about mechanical discontinuities in the MEM 462. Discontinuities may include natural fractures in the formation, or previously induced fractures with varying degrees of permeability. Discontinuities may also include a bedding interface, a fault, or a plane of weakness. The information regarding the discontinuities may be used, for example, to address certain situations, such as cases where a hydraulically induced fracture grows and encounters a mechanical discontinuity (see, e.g., FIGS. 3B-3D, 5, 6A-6C, 7A-7C and 8A-8C).

Figure 5:
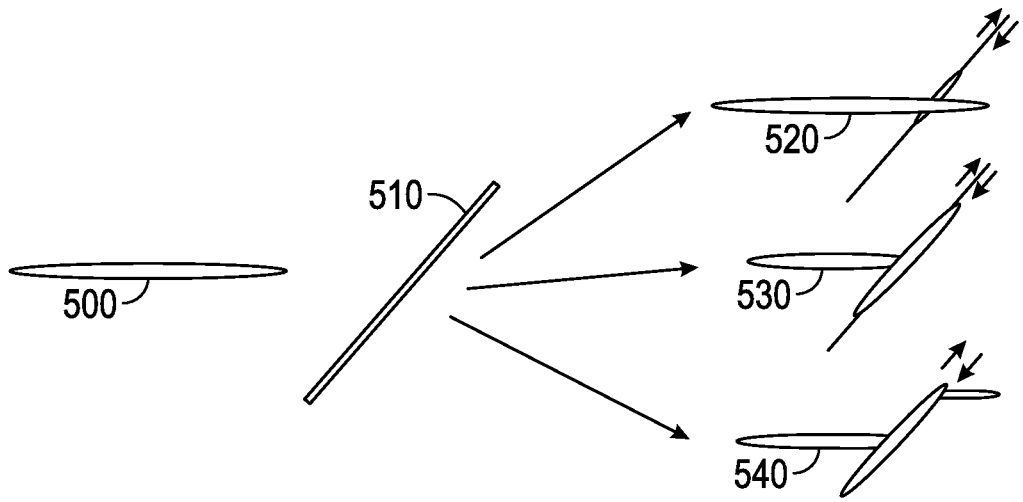
FIG. 5 is a schematic illustration of possible crossing behaviors between an induced fracture and a natural fracture.

As shown in more detail in FIG. 5, the intersection between an induced fracture 500 and a discontinuity 510 can produce multiple scenarios: (i) the induced fracture may continue propagating past the discontinuity at the intersection point (referenced as 520); (ii) the induced fracture may stop at the encountered discontinuity or propagate along a portion of the discontinuity before stopping (referenced as 530); or (iii) the induced fracture may continue propagating past the discontinuity at some offset distance away from the intersection point (referenced as 540). The crossing behavior, or intersection between the discontinuity and the induced fracture, depends on a number of factors, such as, for example, the reservoir geomechanical properties, confining stress, the incident angle of interaction, friction coefficient, the cohesional properties of the pre-existing discontinuity, the viscosity of the fracturing fluid, the injection rate of the fluid, and the presence and concentration of fluid loss additives in the fracturing fluid.

Simulating the crossing behavior in the MEM 462 can provide control over the propagation of the actual induced fracture, for example, and provide further accuracy and precision in predicting production, determining the stimulated area, volume, shape of the stimulated volume, pay zone location and boundaries, and reservoir dimensions and structures. As a result of this simulation, the complexity of the fracture network with an objective permeability affected by specific crossing behaviors may be achieved by adjusting, or optimizing, the well planning 465, staging design 465 and stimulation design 468. For example, operating parameters, like the fluid injection rate, may be increased so that the induced fracture will cross the discontinuity, or oppositely, the fluid injection rate may be decreased to prevent the fracture from further propagation in the formation, and possibly continue its growth along the discontinuity. In another example, characteristics of the fluid, like the viscosity of the fluid, may be increased so that the induced fracture will cross the discontinuity, or oppositely, the viscosity may be decreased to prevent the fracture from further propagation in the formation, and possibly continue its growth along the discontinuity.

Microseismic mapping may also be used in the stimulation design 468 to understand complex fracture growth. Some workflows may integrate these predicted fracture models in a single three-dimensional canvas where microseismic events are overlaid (see, e.g., FIG. 3D), which can be used in fracture design and/or calibrations. The nature and degree of fracture complexity may be assessed using microseismic mapping, and then optimized as discussed herein.

The nature and degree of fracture complexity may be analyzed to select an optimal stimulation design and completion strategy. Fracture modeling may be used to predict the fracture geometry that can be calibrated and the design optimized based on real-time microseismic mapping and evaluation. Fracture growth may be interpreted based on existing hydraulic fracture models. Some complex hydraulic fracture propagation modeling and/or interpretation may also be performed for unconventional reservoirs (e.g., tight gas sand and shale) as will be described further herein. Reservoir properties, and initial modeling assumptions may be corrected and fracture design optimized based on microseismic evaluation.

Production prediction 470 may involve estimating production based on the well planning 465, staging design 466 and stimulation design 468. The result of stimulation design 468 (i.e. simulated fracture models and input reservoir model) can be carried over to a production prediction workflow, where a conventional analytical or numerical reservoir simulator may operate on the models and predicts hydrocarbon production based on dynamic data. The pre-production prediction 470 can be useful, for example, for quantitatively validating the stimulation planning 447 process.

Part or all of the stimulation planning 447 may be iteratively performed as indicated by the flow arrows in FIG. 4A. As shown, optimizations may be provided after the staging design 466, stimulation design 468, and production prediction 470, and may be used as a feedback to optimize 472 the well planning 465, the staging design 466 and/or the stimulation design 468. The optimizations may be selectively performed to feedback results from part or all of the stimulation planning 447 and iterate as desired into the various portions of the stimulation planning process and achieve an optimized result. The stimulation planning 447 may be manually carried out, or integrated using automated optimization processing as schematically shown by the optimization 472 in feedback loop 473.

Figure 4B:
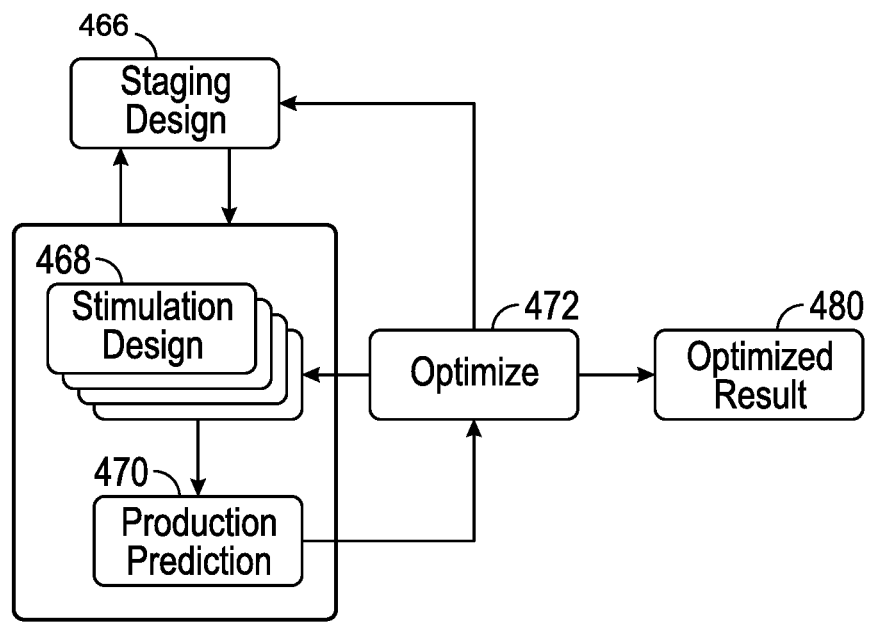
FIG. 4B is a schematic diagram depicting portions of the downhole stimulation operation.

FIG. 4B schematically depicts a portion of the stimulation planning operation 447. As shown in this figure, the staging design 446, stimulation design 468 and production prediction 470 may be iterated in the feedback loop 473 and optimized 472 to generate an optimized result 480, such as an optimized stimulation plan with an optimized crossing behavior. This iterative method allows the inputs and results generated by the staging design 466 and stimulation design 468 to 'learn from each other' and iterate with the production prediction for optimization therebetween.

Various portions of the stimulation operation may be designed and/or optimized. Examples of optimizing fracturing are described, for example, in U.S. Pat. No. 6,508,307, the entire contents of which is hereby incorporated by reference. In another example, financial inputs, such as fracture operation costs (both fixed and variable), oil and natural gas futures, and contribution margins, each of which may affect operations, may also be provided in the stimulation planning 447. Optimization may be performed by optimizing the stimulation design 466 with respect to predicted production while taking into consideration financial inputs. Such financial inputs may involve costs for various stimulation operations at various stages in the wellbore.

Referring back to FIG. 4A, various optional features may be included in the stimulation planning 447. For example, a multi-well planning advisor may be used to determine if it is necessary to construct multiple wells in a formation. If multiple wells are to be formed, the multi-well planning advisor may provide the spacing and orientation of the multiple wells, as well as the best locations within each for perforating and treating the formation. As used herein, the term "multiple wells" may refer to multiple wells each being independently drilled from the surface of the earth to the subterranean formation; the term "multiple wells" may also refer to multiple branches kicked off from a single well that is drilled from the surface of the earth (see, e.g., FIG. 3A). The orientation of the wells and branches can be vertical, horizontal, or anywhere in between.

When multiple wells are planned or drilled, simulations can be repeated for each well so that each well has a staging plan, perforation plan, and/or stimulation plan. Thereafter, multi-well planning can be adjusted if necessary. For example, if a fracture stimulation in one well indicates that a stimulation result will overlap a nearby well with a planned perforation zone, the nearby well and/or the planned perforation zone in the nearby well can be eliminated or redesigned. On the contrary, if a simulated fracture treatment cannot penetrate a particular area of the formation, either because the pay zone is simply too far away for a first fracture well to effectively stimulate the pay zone or because the existence of a natural fracture or high-stress barrier prevents the first fracture well from effectively stimulating the pay zone, a second well/branch or a new perforation zone may be included to provide access to the untreated area. The three-dimensional reservoir model may take into account simulation models and indicate a candidate location to drill a second well/branch or to add an additional perforation zone. A spatial X'-Y'-Z' location may be provided for the oilfield operator's ease of handling.

Crossing Behavior: Designing Hydraulic Fracture Interactions with Mechanical Discontinuities Referring back to FIGS. 4A and 5, reservoir productivity may be improved in areas where it is known that induced hydraulic fractures cross the mechanical discontinuities observed in the formation. For example, by adjusting the operating parameters and fluid characteristics of the fracturing fluid, the propagating hydraulic fracture may cross a number of discontinuities and the offsetting (jog size) will be as small as possible (referenced as 520). As discussed herein, information about mechanical discontinuities may be identified in the mechanical earth model (MEM) 462. Such information may be an input to the well planning 465 and/or the staging design 466 and stimulation design 468. The stimulation design 468 can be used to generate a fracture model, which may identify the nature and degree of fracture complexity that can be anticipated based on the particular well planning 465 and/or the staging design 466 and stimulation design 468. Crossing behaviors may be identified in the fracture model and used to select an optimal stimulation design and completion strategy. Once optimized, the information may be used to update the process and feedback to the pre-treatment evaluation 445 (e.g., the MEM 462).

The operating parameters and fluid characteristics of the fracturing fluid (e.g., the injection rate, fluid viscosity, and/or concentration of fluid loss additives in the fracturing fluid) required to traverse the encountered discontinuities may be generated subsequent to acquiring various wellsite data. For example, wellsite data consisting of geomechanical properties, such as elastic and brittle formation properties, geometrical and hydraulic properties of the mechanical discontinuities, as well as in-situ stress conditions of the subterranean formation. Mechanical properties of the fractures, which may be useful in determining crossing behavior, may also consist of stress field (e.g., maximum and minimum horizontal stress, at least for the case of vertical hydraulic fractures and natural fractures); discontinuity (e.g., mu, toughness mode I and II, permeability of natural fracture, and the like); and formation properties (e.g., Young's modulus, Poisson's ratio, tensile strength and toughness).

A required threshold level for achieving a desired hydraulic fracture crossing behavior in the formation may be achieved by adjusting the operating parameters and fluid characteristics of the fracturing fluid. As shown in FIG. 5, a two-dimensional geometry of interacting fractures can be used to determine fracture interaction. One of the fractures 500 is the hydraulically driven fracture, which propagates due to continuous pumping rate Q from a wellbore toward the second fracture 510, which is a discontinuity, such as a natural fracture (NF). Both fractures 500 and 510 mechanically interact via a common elastic stress field. After the fractures contact each other, the fluid penetrates the NF 510 due to either intrinsic permeability of the NF 510 in a closed state or mechanical openings in the NF 510. The stress field near the interacting fractures may be changing during the process of fracture interaction (i.e., before and after direct contact between the interacting fractures). If the tensile stress field reaches a critical value and extent in space, it may give rise to the initiation of a new fracture 520/540 across the NF 510, which can be a nucleation of the secondary hydraulic fracture growing in the remainder of the formation. If the fracture is initiated and growing further this means the hydraulic fracture has crossed the NF 510. If the new fracture is not initiated, or the initiated fracture does not grow, this means that the fracture 500 has stopped at the NF 510 (referenced as 530).

Achieving a desired hydraulic fracture crossing behavior based on a particular stimulation design 465, the following equations with boundary conditions may be solved.

Elasticity equations define components of the stress tensor $\sigma_{ij}(\vec{r})$ in the point $\vec{r}=(x, y)$, as a function of the fracture opening $w(\vec{\xi}_k)$ and sliding $v(\vec{\xi}_k)$ along the entire contour $\vec{\xi}_k$ of the k-th fracture:

$$\sigma_{ij}(\vec{r}) - \sigma_{ij}^{(\infty)} = \sum_{k=1}^{N} \int_{a_k}^{b_k} \{G_{ijn}(\vec{r}-\vec{\xi}_k)w(\vec{\xi}_k) + G_{ijs}(x-\vec{\xi}_k)v(\vec{\xi}_k)\}d\vec{\xi}_k \quad (1)$$

where $\sigma_{ij}^{(\infty)}$ is the far-field stress tensor components, $G_{ijn}(\vec{r}-\vec{\xi}_k)$ and $G_{ijs}(\vec{r}-\vec{\xi}_k)$ are the Green functions of singular response, which take into account local fracture inclination at the point, and $a_k$ to $b_k$ are the boundaries of k-th fracture.

In order to calculate the profiles of the opening and sliding, $w(\vec{\xi}\_k)$, $v(\vec{\xi}\_k)$ in each k-th fracture, the Equation (1) above is written at the surface of the fractures to give the normal and shear tractions $\sigma\_n^{\rightarrow}(r^{\rightarrow})$, $\tau(r^{\rightarrow})$, $$\sigma_n(\vec{r}) - \sigma_{ij}^{(\infty)} = \sum_{k=1}^{N} \int_{a_k}^{b_k} \{G_{nn}(\vec{r}-\vec{\xi}_k)w(\vec{\xi}_k) + G_{ns}(x-\vec{\xi}_k)v(\vec{\xi}_k)\}d\vec{\xi}_k \quad (2)$$

$$\tau(\vec{r}) - \tau^{(\infty)} = \sum_{k=1}^{N} \int_{a_k}^{b_k} \{G_{sn}(\vec{r}-\vec{\xi}_k)w(\vec{\xi}_k) + G_{ss}(x-\vec{\xi}_k)v(\vec{\xi}_k)\}d\vec{\xi}_k \quad (3)$$

where the normal stress $a\_n^{\rightarrow}(r^{\rightarrow})$ in an open fracture part is set to the local value of fluid pressure $p(r^{\rightarrow})$, and the shear stress $\tau(r^{\rightarrow})$ is set to zero in the open fracture part and to the frictional value $\tau(r^{\rightarrow})=\text{sgn}(\tau) \lambda\sigma\_n^{\rightarrow}$ at the closed and slipped part.

The boundaries of the fractures are fixed or extend if the following fracture growth is met at the fracture tip $b_k$ $$K_{lm}(b_k) > K_{IC} \quad (4)$$

where $K_{IC}$ is the Mode I fracture toughness of the formation, and $K_{lm}$ is the maximum value of the Mode I stress intensity factor in the deviated direction $$K_{lm} = \cos\frac{\theta_m}{2}\left[K_I\cos^2\frac{\theta_m}{2} - \frac{3}{2}K_{II}\sin\theta_m\right] \quad (5)$$

where $K_I$ and $K_{II}$ are the Mode I and Mode II stress intensity factors at the fracture tip, and the angle of fracture tip propagation $\theta_m$ is defined from $$K_I \sin\theta_m + K_{II}(3\cos\theta_m - 1) = 0 \quad (6)$$

The criteria for the initiation of a new tensile crack of a certain length must satisfy Equation (4) for both energy release rate and the stress criterion $$\sigma_{min} > T_o \quad (7)$$

where $\sigma_{min}$ is the minimum value of the maximum tensile stress along the projected crack path, and $T_o$ is the tensile strength of the formation.

Pressure distribution is defined by the equation for 2D fluid flow along the fractures:

$$q = -\frac{(w+\overline{w})^3}{12\mu}\frac{\partial p}{\partial x} \quad (8)$$

where q is the local 2D flow rate at the fracture, $\overline{w}$ is the residual fracture opening in the closed state with permeability being defined as $k=\overline{w}^2/12$ and $\mu$ is the fluid viscosity.

The fluid volume continuity equation in the absence of leak-off into formation is:

$$\frac{\partial w}{\partial t} + \frac{\partial q}{\partial x} = 0 \qquad (9)$$

The boundary condition at the inlet of a hydraulic fracture can be written as:

$$q(a_0,t)=Q \qquad (10)$$

In one non-limiting example, the hydraulic fracture propagates along the maximum principal stress direction until it reaches the discontinuity. In one non-limiting example, the formation has a Young's modulus of 30 GPa and a Poisson ratio of 0.3. The minimum principal in situ stress normal to the induced hydraulic fracture is 25 MPa and the maximum component is 35 MPa. Mode I fracture toughness of the formation matrix is 1 MPa·m$^{0.5}$ and tensile strength is 0.1 MPa. The natural fracture is cohesionless with a coefficient of friction between the edges of about 0.6. Permeability of the interface is about 8.33 Darcy (average hydraulic opening in the closed state is 10 microns). The hydraulic fracture is pumped by a Newtonian fluid with viscosity 1 cP (i.e. 0.001 Pa·sec) and 2D rate 0.000265 m$^2$/sec (i.e. 0.1 bpm/m) until it reaches the discontinuity located at about 1 m in length from the inlet. No crossing occurs in this particular case and after intersecting with a pre-existing fracture approximately all of the fracturing fluid leaks into the fracture. The hydraulic fracture is stopped and deflected at the first encountered discontinuity (610, FIG. 6A).

Figure 6A:
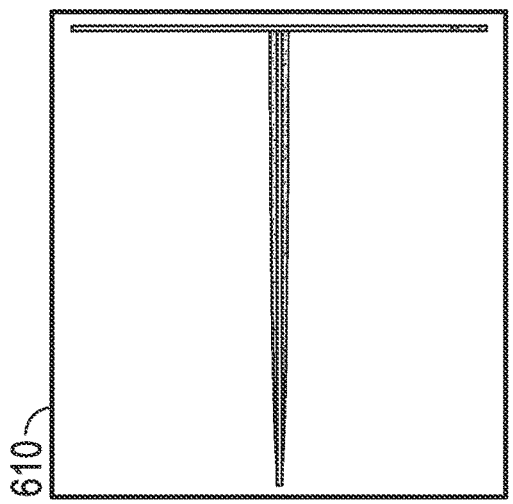
FIGS. 6A-6C are schematic illustrations of orthogonal crossing behaviors between a discontinuity and an induced hydraulic fracture.
Figure 6B:
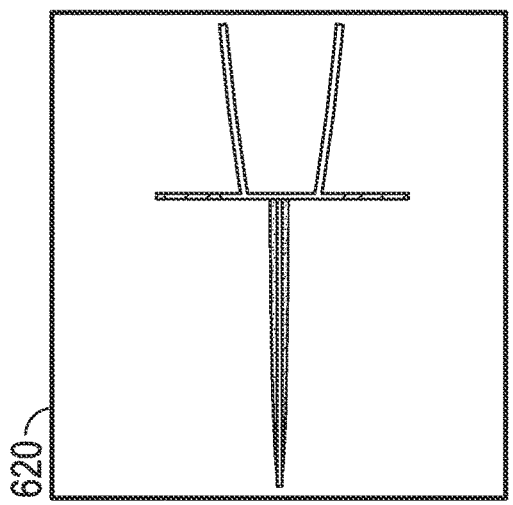
Figure 6C:
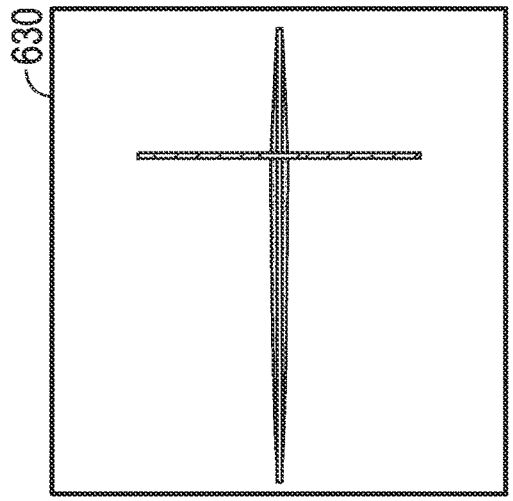

FIGS. 6A-6C depict orthogonal crossing behaviors between the discontinuity and the induced hydraulic fracture with injection rate 1 bpm/m (610, FIG. 6A), 5 bpm/m (620, FIG. 6B) and 10 bpm/m (630, FIG. 6C). If the pumping rate is increased, in one non-limiting example, the pumping rate is increased five times, and the same job is performed with 2D rate 0.01325 m2/sec (i.e. 5 bpm/m), the hydraulic fracture will cross the discontinuity and create different branches as shown in 620, FIG. 6B. A further increase of an injection rate to 10 bpm/m gives a straight propagation across the NF without offsetting (630, FIG. 6C).

Figure 7A:
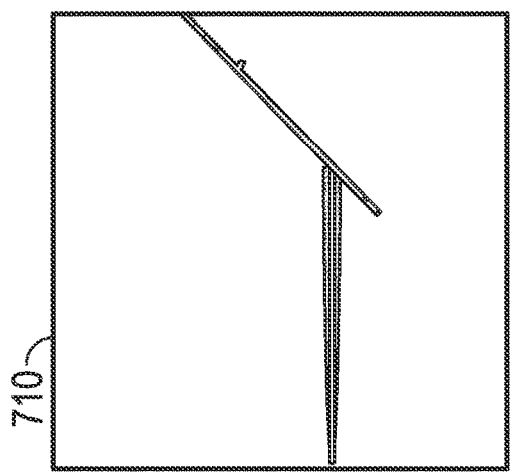
FIGS. 7A-7C are schematic illustrations of tilted crossing behaviors of a discontinuity by the induced hydraulic fracture.
Figure 7B:
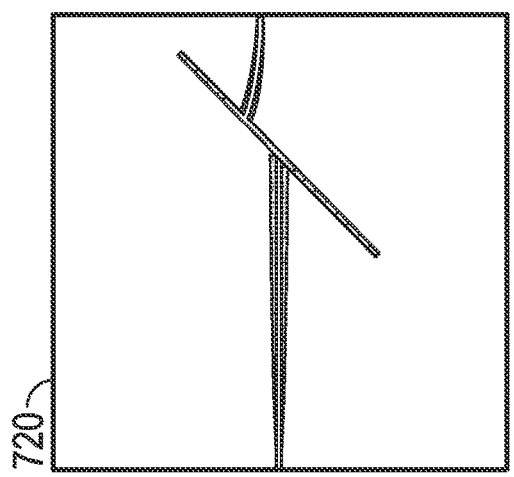
Figure 7C:
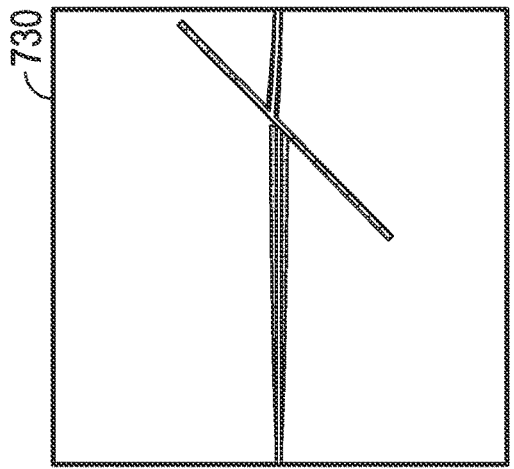

In another non-limiting example, shown in FIGS. 7A-7C, an inclined interaction occurs between the discontinuity and the induced hydraulic fracture with a similar tendency as previously shown in the examples of FIGS. 6A-6C. FIGS. 7A-7C depict a tilted (e.g., 45°) crossing of the discontinuity by the induced hydraulic fracture with an injection rate of 0.1 bpm/m (710, FIG. 7A), 1 bpm/m (720, FIG. 7B) and 5 bpm/m (730, FIG. 7C). The natural fracture shown in FIGS. 7A-7C has the same permeability and friction as the natural fracture of FIGS. 6A-6C but slight cohesion c=0.1 MPa. The pumping fluid viscosity is more viscous than previously 10 cP (i.e. 0.01 Pa·sec). Similar to the previous example, the 2D injection rate is changed from 0.000265 m2/sec (i.e. 0.1 bpm/m) to 0.01325 m2/sec (i.e. 5 bpm/m). The results of modeling show that the crossing now occurs in all of these cases but with a different offset along the discontinuity. As shown in the example herein, the higher the injection rate the shorter the jog size. The jog size may be decreased to some minimum value if the fluid viscosity or injection rate is increased.

Figure 8A:
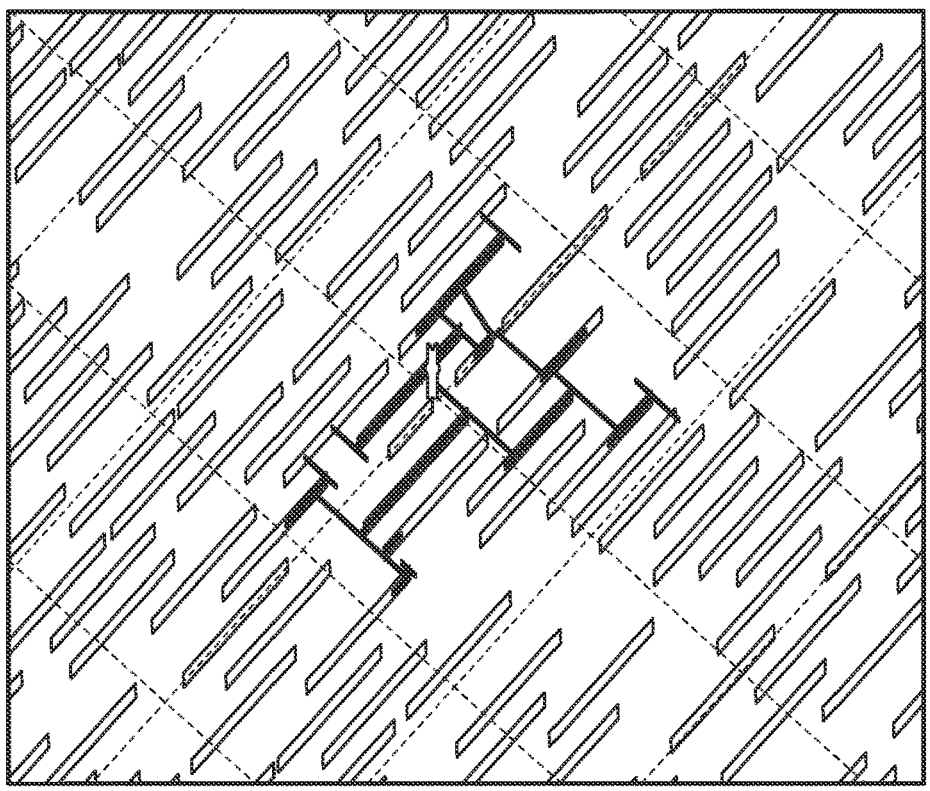
FIGS. 8A-8B are schematic illustrations of interactions of an induced hydraulic fracture propagating in a modeled formation with pre-existing natural fractures.
Figure 8B:
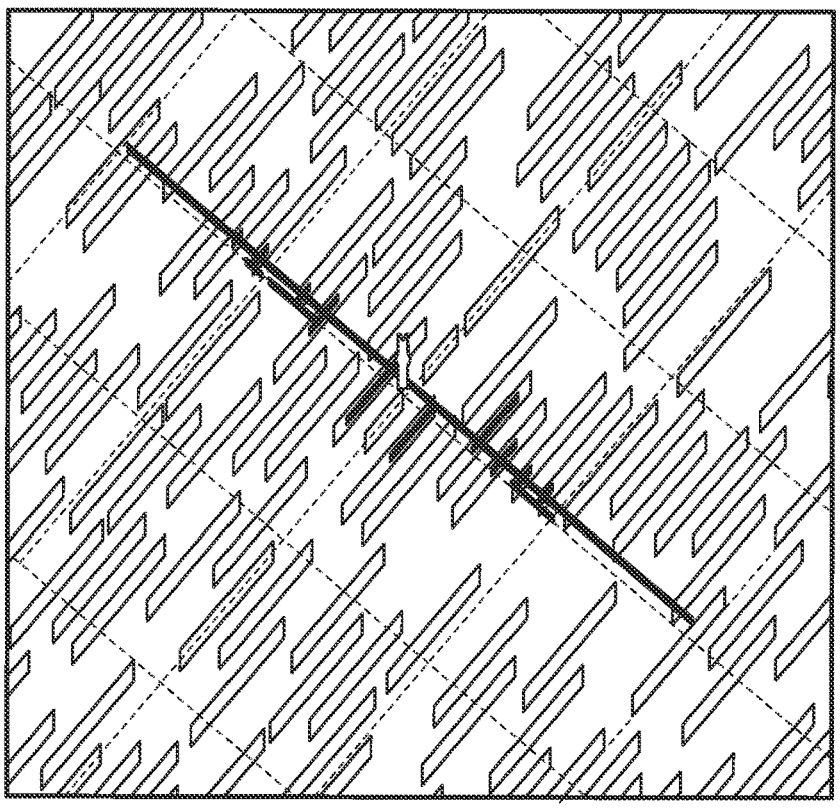

Referring now to FIGS. 8A-8B, another non-limiting example of interactions of an induced hydraulic fracture propagating in a formation with pre-existing natural fractures is shown. In the non-limiting example shown, the formation has a Young's modulus of 34 GPa and a Poisson ratio of 0.25. The minimum principal in situ stress normal to the induced hydraulic fracture is 35 MPa and the maximum component is 42 MPa. Mode I fracture toughness of the formation matrix is 1.1 MPa·m$^{0.5}$ and tensile strength is 3.4 MPa. The hydraulic fracture is pumped by a Newtonian fluid with viscosity 43 cP at an injection rate of 0.13 m$^3$/sec. In FIG. 8A, the fracture model neglects the effect of injection rate and viscosity on the crossing behavior, whereas FIG. 8B accounts for the injection rate and viscosity.

Figure 9A:
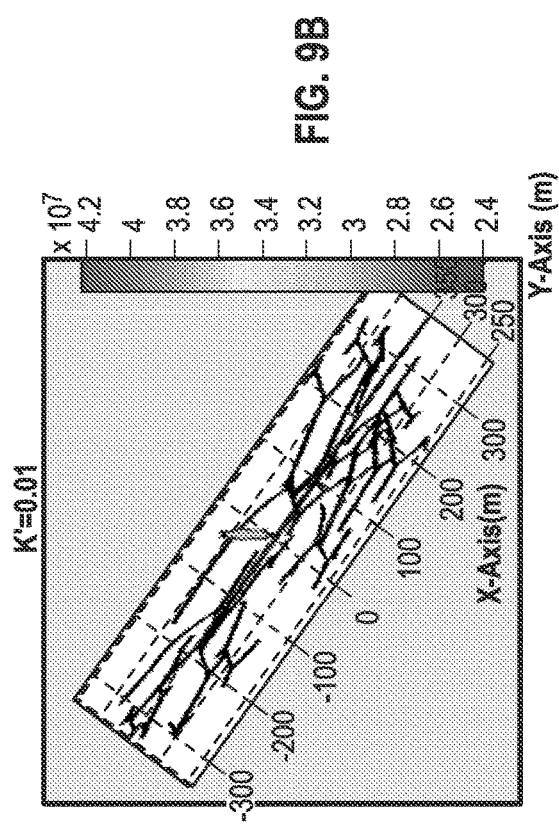
FIGS. 9A-9H are schematic illustrations of potential effects of varying fluid properties on crossing behaviors.
Figure 9B:
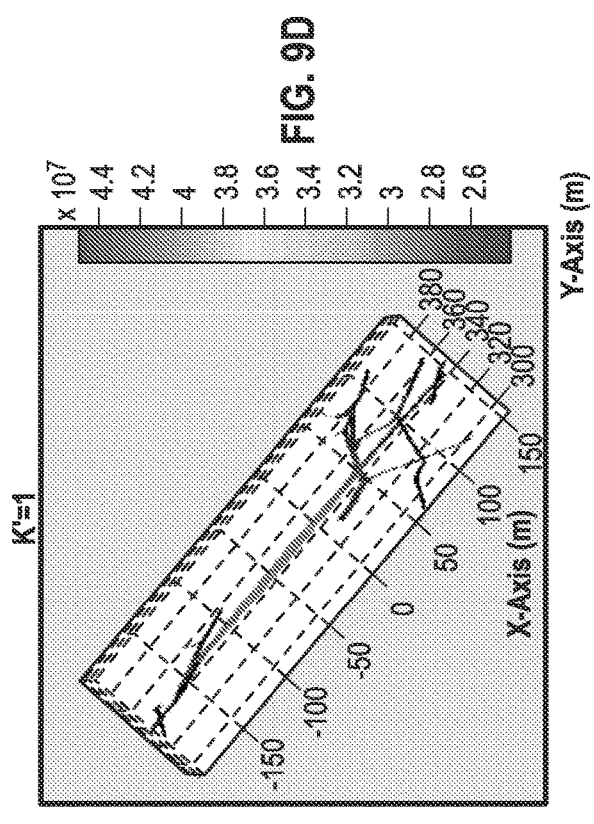
Figure 9C:
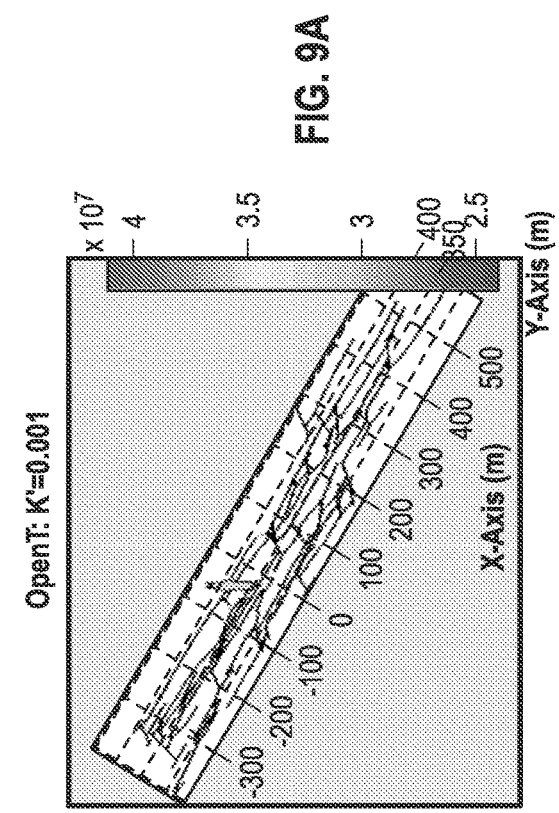
Figure 9D:
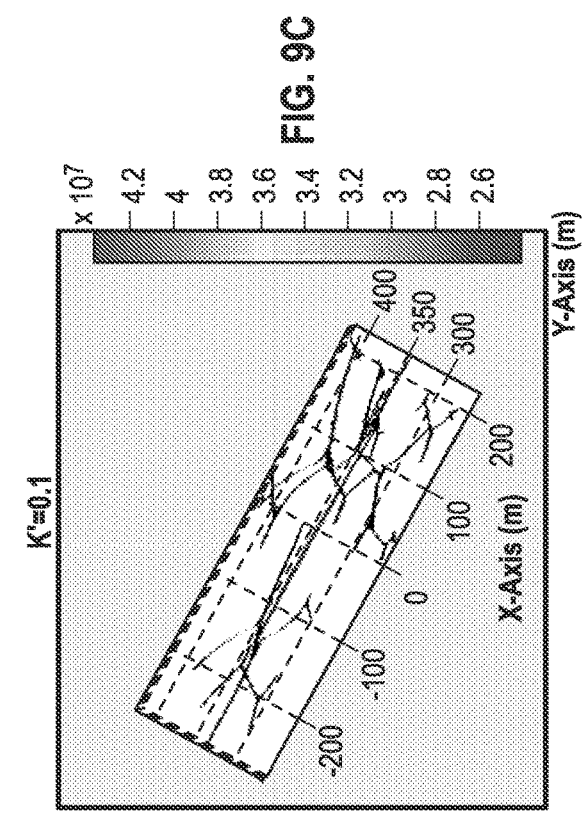
Figure 9E:
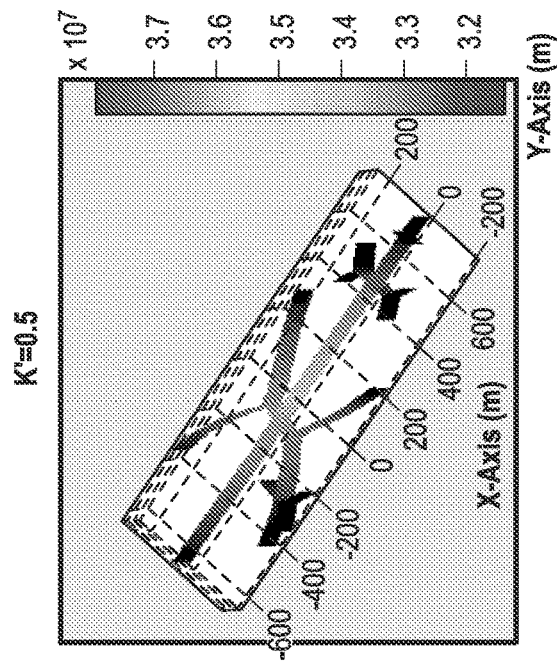
Figure 9F:
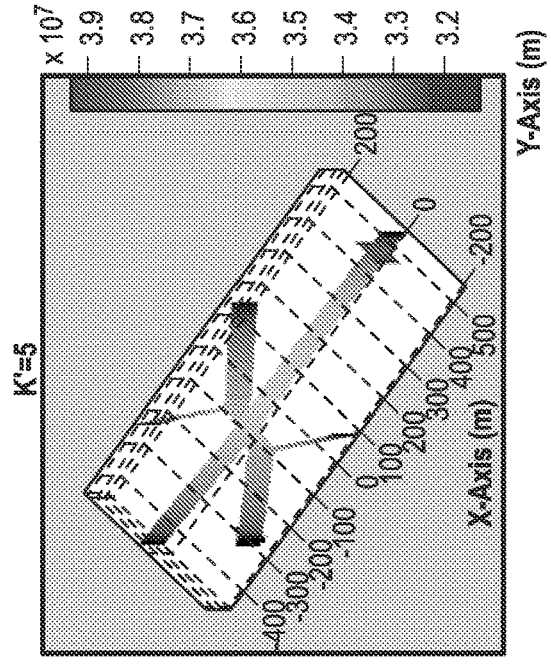
Figure 9G:
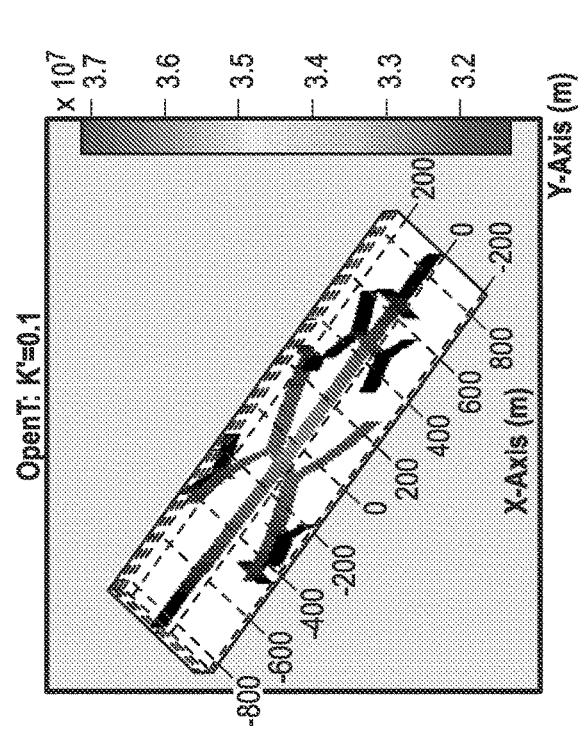

In the illustrations shown in FIGS. 9A-9H, additional non-limiting examples of the varying effects of fluid properties on crossing behaviors are shown. In FIGS. 9A-9D, the formation has a Young's modulus of 27:34 GPa and a Poisson ratio of 0.2:0.38. The minimum principal in situ stress normal to the induced hydraulic fracture is 23.9:29.7 MPa and the maximum component is 24.6:30.4 MPa. Mode I fracture toughness of the formation matrix is 1.1:1.3 MPa·m$^{0.5}$ and tensile strength is 3.4 MPa. In FIGS. 9A-9D, the hydraulic fracture is induced by a fluid at an injection rate of 0.13 m$^3$/sec. However, the viscosity (K') varies between 0.001 (FIG. 9A), to 0.01 (FIG. 9B), to 0.1 (FIG. 9C), and to 1 (FIG. 9D). As shown the complexity of the fracture network and crossing behaviors change with the changing viscosity. For example, depending on the desired criteria and production prediction, FIG. 9D may depict an optimized crossing behavior as compared to FIGS. 9A-9C. Likewise, FIG. 9B may provide increased production, and therefore depict an optimized crossing behavior as compared to FIGS. 9A, 9C and 9D.

Figure 9H:
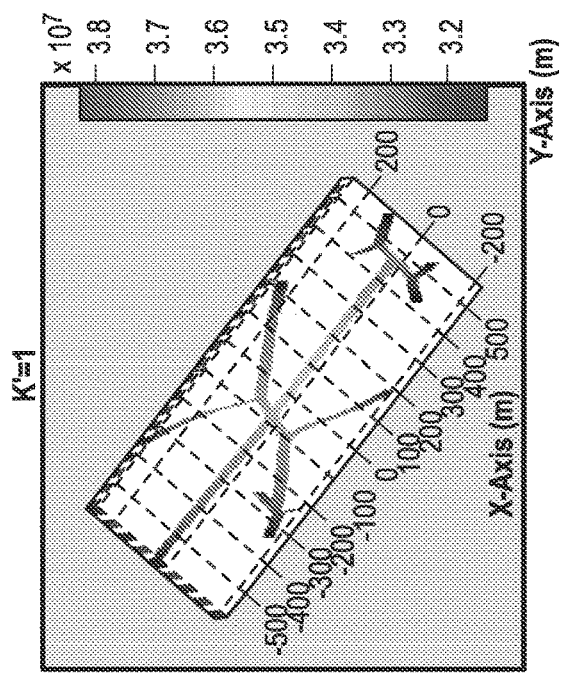

In yet another non-limiting example, shown in FIGS. 9E-9H, the formation has a Young's modulus of 27.5 GPa and a Poisson ratio of 0.24. The minimum principal in situ stress normal to the induced hydraulic fracture is 31.2 MPa and the maximum component is 31.7 MPa. Mode I fracture toughness of the formation matrix is 1.1 MPa·m$^{0.5}$ and tensile strength is 3.4 MPa. In FIGS. 9E-9H, the hydraulic fracture is induced by a fluid at an injection rate of 0.21 m$^3$/sec. However, the viscosity (K') varies between 0.1 (FIG. 9E), to 0.5 (FIG. 9F), to 1 (FIG. 9G), and to 5 (FIG. 9H). As shown the complexity of the fracture network and crossing behaviors change with the changing viscosity. For example, depending on the desired criteria and production prediction, FIG. 9H may depict an optimized crossing behavior as compared to FIGS. 9E-9G. Likewise, FIG. 9G may provide increased production, and therefore depict an optimized crossing behavior as compared to FIGS. 9E, 9F and 9H.

In addition to fluid viscosity and flow rate, the crossing behavior may also be influenced by the permeability or residual fracture opening in the natural fractures, as indicated in Eq. (8). Large permeability can cause the fracturing fluid to more easily penetrate into the natural fracture, leading to fracture arrest by the natural fracture. To promote fracture crossing behavior, fluid loss additives, which is typically fine particular materials, can be added in the fracturing fluid to cause the particles to bridge inside the natural fracture and prevent or reduce fluid penetration. These additives may also include biocides, fluid-loss agents, enzyme breakers, acid breakers, oxidizing breakers, friction reducers, and surfactants such as emulsifiers and non-emulsifiers. In accordance with at least one embodiment disclosed herein, one can select, or increase the concentration, of a particular fluid loss additive(s) that are effective in plugging natural fractures of known permeability to minimize fluid penetration into the natural fracture and consequently enhance crossing. Conversely, one can remove, or decrease the concentration of, the particular fluid loss additive known to maximize fluid penetration into the natural fracture so as to not cross the discontinuity and help generate branched fractures, thereby increasing fracture surface area. Such desired crossing behaviors are based on the properties of the reservoir to be stimulated to achieve maximum production.

Figure 10:
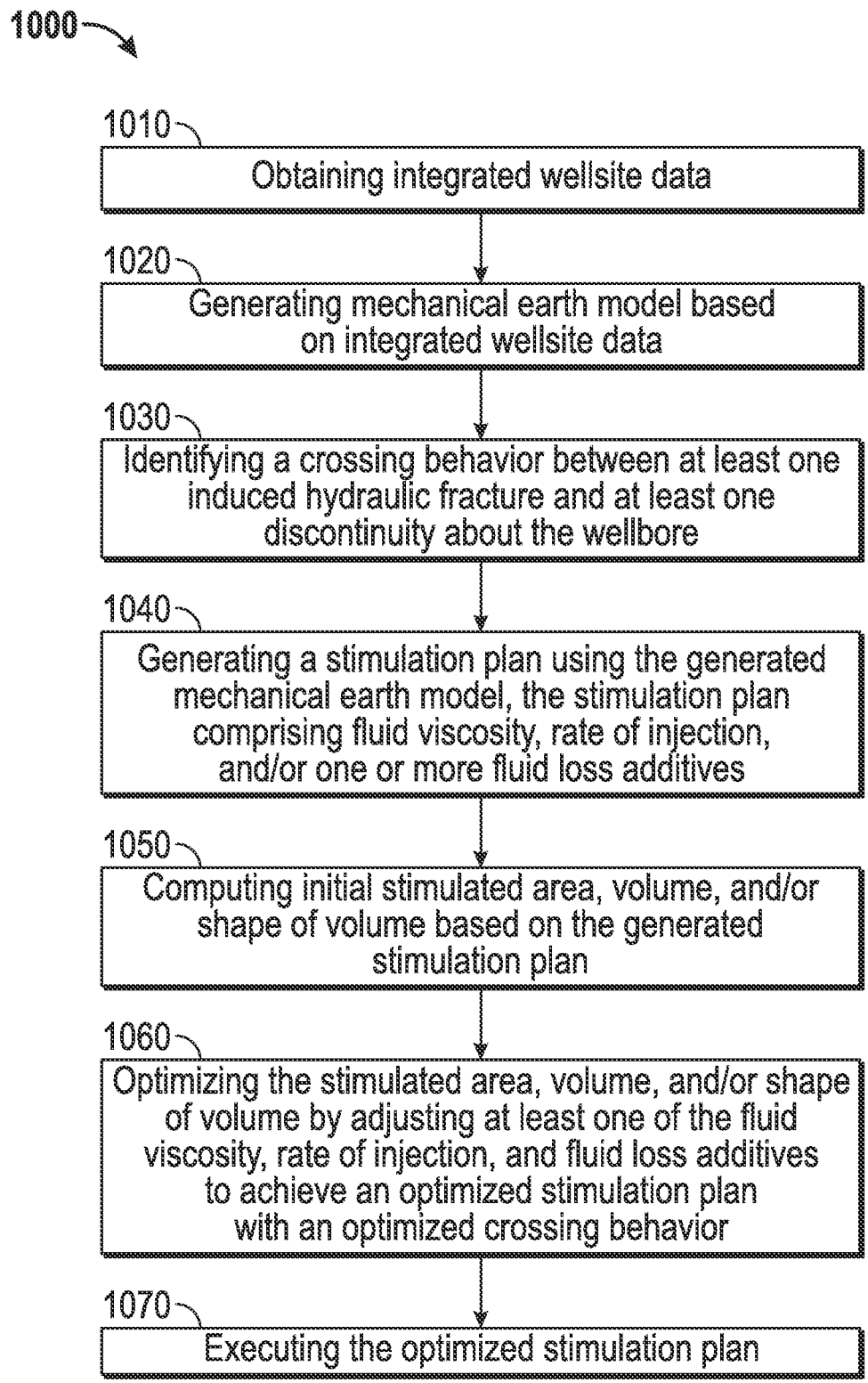
FIG. 10 is a flow diagram illustrating a method of performing a stimulation operation.

FIG. 10 is a flow diagram illustrating a method (1000) of performing a stimulation operation. The method involves obtaining (1010) integrated wellsite data (e.g., geomechanical, geological, and/or geophysical properties of the formation, and/or geometrical properties of the mechanical discontinuities in the formation). The method also includes generating (1020) a mechanical earth model (MEM) based on the integrated wellsite data, and identifying (1030) a crossing behavior between at least one induced hydraulic fracture and at least one discontinuity in the formation, or about the wellbore. The method further involves generating (1040) a stimulation plan using the generated mechanical earth model, the stimulation plan comprising fluid viscosity, rate of injection, and/or one or more fluid loss additives. The method may also involve computing (1050) the initial stimulated area, volume, and/or shape of the volume based on the generated stimulation plan, and optimizing (1060) the stimulated area, volume, and/or shape of the volume by adjusting at least one of the fluid viscosity, rate of injection, and fluid loss additives to achieve an optimized stimulation plan with an optimized crossing behavior. The optimized stimulation plan may then be executed (1070).

Post Planning Stimulation Operations

Embodiments may also include real-time treatment optimization (or post job workflows) 451 for analyzing the stimulation operation and updating the stimulation plan during actual stimulation operations. Referring back to FIG. 4A, the real-time treatment optimization 451 may be performed during implementation of the stimulation plan at the wellsite (e.g., performing fracturing, injecting or otherwise stimulating the reservoir at the wellsite). The real-time treatment optimization may involve calibration tests 449, executing 448 the stimulation plan generated in stimulation planning 447, and real-time oilfield stimulation 455.

Calibration tests 449 may optionally be performed by comparing the result of stimulation planning 447 (i.e. simulated fracture models) with the observed data. Some embodiments may integrate calibration into the stimulation planning process, perform calibrations after stimulation planning, and/or apply calibrations in real-time execution of stimulation or any other treatment processes. Examples of calibrations for fracture or other stimulation operations are described in US Patent Application No. 2011/0257944, the entire contents of which are hereby incorporated by reference.

Based on the stimulation plan generated in the stimulation planning 447 (and calibration 449 if performed), the oilfield stimulation may be executed 448. Oilfield stimulation 455 may involve real-time measurement 461, real-time interpretation 463, real-time stimulation design 465, real-time production 467 and real-time control 469. Real-time measurement 461 may be performed at the wellsite using, for example, the sensors (S) as shown in FIG. 3A. Observed data may be generated using real-time measurements 461. Observation from a stimulation treatment well, such as bottom-hole and surface pressures, may be used for calibrating models (traditional pressure match workflow). In addition, microseismic monitoring technology may be included as well. Such spatial/time observation data may be compared with the predicted fracture model.

Real-time interpretation 463 may be performed on- or off-site based on the data collected. Real-time stimulation design 465 and production prediction 467 may be performed similar to the stimulation design 468 and production prediction 470, but based on additional information generated during the actual oilfield stimulation 455 performed at the wellsite. Optimization 471 may be provided to iterate over the real-time stimulation design 465 and production prediction 467 as the oilfield stimulation progresses. Real-time stimulation 455 may involve, for example, real-time fracturing. Examples of real-time fracturing are described in US Patent Application No. 2010/0307755, the entire contents of which are hereby incorporated by reference.

Real-time control 469 may be provided to adjust the stimulation operation at the wellsite as information is gathered and an understanding of the operating conditions is gained. The real-time control 469 provides a feedback loop for executing 448 the oilfield stimulation 455. Real-time control 469 may be executed, for example, using the surface unit 334 and/or downhole tools 306.1-306.4 to alter operating conditions, such as perforation locations, injection pressures, etc. While the features of the oilfield stimulation 455 are described as operating in real-time, one or more of the features of the real-time treatment optimization 451 may be performed in real-time or as desired.

The information generated during the real-time treatment optimization 451 may be used to update the process and feedback to the pre-treatment evaluation 445. The design/model update 453 includes post treatment evaluation 475 and update model 477. The post treatment evaluation involves analyzing the results of the real-time treatment optimization 451 and adjusting, as necessary, inputs and plans for use in other wellsites or wellbore applications.

The post treatment evaluation 475 may be used as an input to update the model 477. Optionally, data collected from subsequent drilling and/or production can be fed back to the pre-treatment evaluation 445 (e.g., the mechanical earth model) and/or stimulation planning 447 (e.g., well planning module 465). Information may be updated to remove errors in the initial modeling and simulation, to correct deficiencies in the initial modeling, and/or to substantiate the simulation. For example, spacing or orientation of the wells may be adjusted to account the newly developed data. Once the model is updated 477, the process may be repeated as desired. One or more wellsites, wellbores, stimulation operations or variations may be performed using the method 400.

In a given example, a stimulation operation may be performed by constructing a three-dimensional model of a subterranean formation and performing a semi-automated method involving dividing the subterranean formation into a plurality of discrete intervals, characterizing each interval based on the subterranean formation's properties at the interval, grouping the intervals into one or more drilling sites, and drilling a well in each drilling site.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

In a given example, a stimulation operation may be performed involving evaluating variability of reservoir properties and completion properties separately for a treatment interval in a wellbore penetrating a subterranean formation, partitioning the treatment interval into a set of contiguous intervals (both reservoir and completion properties may be similar within each partitioned treatment interval, designing a stimulation treatment scenario by using a set of planar geometric objects (discrete fracture network) to develop a reservoir model, and combining natural fracture data with the reservoir model to account heterogeneity of formation and predict hydraulic fracture progressions.

What is claimed is:

1. A method of performing a fracturing operation about a wellbore penetrating a subterranean formation, the subterranean formation having mechanical discontinuities thereabout, the method comprising:
   acquiring integrated wellsite data, the integrated wellsite data comprising geomechanical properties of the subterranean formation and geometrical properties of the mechanical discontinuities;
   generating a mechanical earth model using the integrated wellsite data;
   identifying in the mechanical earth model a crossing behavior at an intersection between at least one induced hydraulic fracture and at least one discontinuity in the subterranean formation identified from the integrated wellsite data;
   generating a stimulation plan using the mechanical earth model, the stimulation plan comprising fluid viscosity and rate of injection of a fracturing fluid, and wherein generating the stimulation plan comprises performing real-time stimulation design and production prediction based on real-time interpretation of acquired real-time data, and optimizing the stimulation plan in real-time by repeating the real-time stimulation design and the production prediction in a feedback loop until a real-time optimized stimulation plan is generated;
   adjusting at least one of the rate of injection and fluid viscosity of the stimulation plan to achieve an optimized crossing behavior at an intersection between at least one induced hydraulic fracture and at least one discontinuity in the subterranean formation;
   performing the fracturing operation using the stimulation plan to generate a fracture network in the subterranean formation comprising the optimized crossing behavior;
   measuring at least a portion of a combination of geomechanical, geological, and geophysical properties of the subterranean formation, and mechanical properties of the at least one discontinuity during the fracturing operation; and
   selectively optimizing the crossing behavior at an intersection between the induced hydraulic fracture and the at least one discontinuity.

2. The method of claim 1, wherein the integrated wellsite data further comprises one or more of geological, and geophysical properties of the subterranean formation, and mechanical properties of the at least one discontinuity.

3. The method of claim 1, wherein the adjusting further comprises adjusting a concentration of fluid loss additives in the fracturing fluid to achieve the optimized crossing behavior.

4. A method of performing a stimulation operation for a wellsite having a reservoir positioned in a subterranean formation, the method comprising:
   performing a stimulation operation using a mechanical earth model based on integrated wellsite data, wherein the mechanical earth model comprises a crossing behavior at an intersection between an induced hydraulic fracture and a mechanical discontinuity in the subterranean formation;
   acquiring real-time data while performing the stimulation operation;
   generating a stimulation plan using the mechanical earth model, the stimulation plan comprising fluid viscosity and rate of injection of a fracturing fluid, wherein generating the stimulation plan comprises performing real-time stimulation design and production prediction based on real-time interpretation of the acquired real-time data, and optimizing the stimulation plan in real-time by repeating the real-time stimulation design and the production prediction in a feedback loop until a real-time optimized stimulation plan is generated; and
   adjusting at least one of the fluid viscosity and rate of injection to achieve an optimized stimulation operation, wherein the adjusting is based on the acquired real-time data.

5. The method of claim 4, wherein the integrated wellsite data comprises at least in part, one or more of geomechanical, geological, and geophysical properties of the subterranean formation, and mechanical and geometrical properties of the mechanical discontinuity.

6. The method of claim 4, wherein the adjusting comprises selectively optimizing the crossing behavior between the induced hydraulic fracture and the mechanical discontinuity.

7. The method of claim 6, wherein selectively optimizing the crossing behavior comprises selectively optimizing whether the induced hydraulic fracture crosses the mechanical discontinuity, whether the induced hydraulic fracture propagates along the mechanical discontinuity, and whether the induced hydraulic fracture propagates along the mechanical discontinuity and crosses the mechanical discontinuity.

8. The method of claim 4, wherein the mechanical discontinuity in the subterranean formation is one of a natural fracture, a bedding plane, a fault, and a plane of weakness.

9. The method of claim 4, wherein the stimulation plan further comprises a fluid loss additive, and the adjusting further comprises adjusting a concentration of the fluid loss additive in the fracturing fluid to achieve an optimized fracture operation.

10. A method of performing a stimulation operation for a wellsite having a reservoir positioned in a subterranean formation, comprising:
   performing reservoir characterization using a reservoir characterization model to generate a mechanical earth model based on integrated wellsite data;
   generating a stimulation plan by performing well planning, staging design, stimulation design and production prediction based on the mechanical earth model;
   identifying in the mechanical earth model a crossing behavior at an intersection between at least one induced hydraulic fracture and at least one discontinuity in the subterranean formation;
   optimizing the stimulation plan by repeating the stimulation design and the production prediction in a feedback loop until an optimized crossing behavior is generated between the at least one induced hydraulic fracture and the at least one discontinuity in the subterranean formation;
   executing the optimized stimulation plan by stimulating a reservoir at the wellsite consistent with the optimized stimulation plan;
   measuring real-time data from the wellsite during the executing the optimized stimulation plan;
   performing real-time interpretation based on the measured real-time data;

performing real-time stimulation design and production prediction based on the real-time interpretation; and optimizing in real-time the optimized stimulation plan by repeating the real-time stimulation design and the production prediction in a feedback loop until a real-time optimized stimulation plan is generated.

11. The method of claim 10, wherein the integrated wellsite data comprises, at least in part, one or more of a geomechanical, geological, and geophysical property of the subterranean formation, and a mechanical and geometrical property of the at least one discontinuity in the subterranean formation.

12. The method of claim 11, further comprising measuring at least a portion of the geomechanical, geological, and geophysical property of the subterranean formation, and the mechanical and geometrical property of the at least one discontinuity in the subterranean formation.

13. The method of claim 10, wherein optimizing the stimulation plan comprises repeating the well planning, staging design, stimulation design, and production prediction in a feedback loop until the optimized crossing behavior is generated.

14. The method of claim 10, wherein at least one of the well planning, staging design, stimulation design and production prediction comprises fluid viscosity, rate of injection of a fracturing fluid, and concentration of fluid loss additives in the fracturing fluid; and wherein optimizing the stimulation plan further comprises adjusting at least one of the fluid viscosity, rate of injection of the fracturing fluid, and concentration of fluid loss additives in the fracturing fluid until the optimized crossing behavior is generated.

15. The method of claim 10, further comprising controlling the stimulation operation based on the real-time optimized stimulation plan.

16. The method of claim 10, further comprising evaluating the wellsite after executing the optimized stimulation plan.

17. The method of claim 16, further comprising updating at least one of the reservoir characterization model and the mechanical earth model based on the evaluating.

18. The method of claim 10, further comprising updating at least one of the reservoir characterization model and the mechanical earth model based on an evaluation of real-time data gathered during an execution of the optimized stimulation plan.

19. The method of claim 10, wherein the stimulation design is performed using a fracture model.

20. The method of claim 10, wherein the production prediction is performed using financial inputs.

21. The method of claim 10, wherein the reservoir comprises one of at least one tight gas sand reservoir and a shale reservoir.

22. A system for performing a stimulation operation for a wellsite having a wellbore penetrating a subterranean formation, the subterranean formation having mechanical discontinuities thereabout, the system comprising:

a surface unit comprising a processor; and
a stimulation tool comprising:
 a reservoir characterization unit that performs reservoir characterization using a reservoir characterization model to generate a mechanical earth model based on integrated wellsite data, when executed by the processor;
 a stimulation planning unit that generates a stimulation plan using the mechanical earth model, when executed by the processor, the stimulation plan comprising fluid viscosity and rate of injection of a fracturing fluid, and wherein the stimulation planning unit is configured to perform real-time stimulation design and production prediction based on real-time interpretation of acquired real-time data, when executed by the processor;
 an optimizer that optimizes the stimulation plan by adjusting at least one of the fluid viscosity and rate of injection to achieve an optimized stimulation plan having an optimized crossing behavior at an intersection between at least one induced hydraulic fracture and at least one discontinuity in the subterranean formation, when executed by the processor;
 a real-time unit that optimizes in real-time the optimized stimulation plan while the stimulation plan is performed at the wellsite, when executed by the processor, wherein the optimized stimulation plan is based on information gathered during the stimulation operation, and wherein the real-time unit is configured to optimize in real-time the optimized stimulation plan by repeating the real-time stimulation design and the production prediction in a feedback loop until a real-time optimized stimulation plan is generated, when executed by the processor; and
 a control unit that selectively adjusts the stimulation operation based on the optimized stimulation plan, when executed by the processor.

23. The system of claim 22, further comprising at least one downhole tool positional in the wellbore at the wellsite, the at least one downhole tool operatively connectable to the stimulation tool.

24. The system of claim 23, wherein the at least one downhole tool comprises at least one of a wireline tool, a drilling tool, a perforating tool, an injection tool, and combinations thereof.

25. The system of claim 22, wherein the integrated wellsite data comprises a geomechanical, geological, and geophysical property of the subterranean formation, and a mechanical and geometrical property of the at least one discontinuity in the subterranean formation.

* * * * *